(«12») United States Patent  
Shafer et al.

(10) Patent No.: US 7,426,082 B2  
(45) Date of Patent: Sep. 16, 2008

(54) CATADIOPTRIC PROJECTION OBJECTIVE WITH GEOMETRIC BEAM SPLITTING

(75) Inventors: David R. Shafer, Fairfield, CT (US); Alexander Epple, Aalen (DE); Aurelian Dodoc, Oberkochen (DE); Helmut Beierl, Heidenheim (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/282,587

(22) Filed: Nov. 21, 2005

(65) Prior Publication Data

US 2006/0077366 A1   Apr. 13, 2006

Related U.S. Application Data

(60) Division of application No. 10/734,623, filed on Dec. 15, 2003, now Pat. No. 6,995,930, which is a continuation-in-part of application No. 09/751,352, filed on Dec. 27, 2000, now Pat. No. 6,665,126.

(60) Provisional application No. 60/511,673, filed on Oct. 17, 2003, provisional application No. 60/222,798, filed on Aug. 2, 2000, provisional application No. 60/173,523, filed on Dec. 29, 1999.

(51) Int. Cl.  
*G02B 17/00* (2006.01)  
*G02B 9/00* (2006.01)

(52) U.S. Cl. ............... 359/727; 359/364; 359/649

(58) Field of Classification Search ......... 359/364–366, 359/649, 726, 727, 730, 732, 733  
See application file for complete search history.

(56) References Cited

U.S. PATENT DOCUMENTS

| 4,779,966 | A | 10/1988 | Friedman |
| 4,953,960 | A | 9/1990 | Williamson |
| 5,052,763 | A | 10/1991 | Singh et al. |
| 5,220,454 | A | 6/1993 | Ichihara et al. |
| 5,289,312 | A | 2/1994 | Hashimoto et al. |
| 5,636,066 | A | 6/1997 | Takahashi |
| 5,638,218 | A | 6/1997 | Oomura |

(Continued)

FOREIGN PATENT DOCUMENTS

DE   195 35 392 A1   3/1997

(Continued)

OTHER PUBLICATIONS

Erich Heynacher, "Asphärische Optik—Warum sie gefordert, und wie sie gerfertigt wird," Zeiss—Inform., 1978/1979, pp. 19-25, vol. 24, No. 88, Oberkochen, Germany.

(Continued)

*Primary Examiner*—William C Choi  
(74) *Attorney, Agent, or Firm*—Sughrue Mion, PLLC

(57) ABSTRACT

A projection exposure lens has an object plane, optical elements for separating beams, a concave mirror, an image plane, a first lens system arranged between the object plane and the optical elements for separating beams, a second double pass lens system arranged between the optical elements for separating beams and the concave mirror, a third lens system arranged between the optical elements for separating beams and the image plane. The second lens system has a maximum of five lenses.

22 Claims, 13 Drawing Sheets

U.S. PATENT DOCUMENTS

| | | | |
|---|---|---|---|
| 5,668,673 A | 9/1997 | Suenaga et al. | |
| 5,689,377 A | 11/1997 | Takahashi | |
| 5,691,802 A | 11/1997 | Takahashi | |
| 5,694,241 A | 12/1997 | Ishiyama et al. | |
| 5,742,436 A | 4/1998 | Fuerter | |
| 5,808,805 A * | 9/1998 | Takahashi | 359/651 |
| 5,831,770 A | 11/1998 | Matsuzawa et al. | |
| 5,861,997 A | 1/1999 | Takahashi | |
| 5,969,882 A | 10/1999 | Takahashi | |
| RE36,740 E | 6/2000 | Ichihara et al. | |
| 6,081,382 A | 6/2000 | Omura | |
| 6,157,498 A | 12/2000 | Takahashi | |
| 6,195,213 B1 | 2/2001 | Omura et al. | |
| 6,377,332 B1 * | 4/2002 | Sakuma et al. | 355/53 |
| 6,392,822 B1 | 5/2002 | Takahashi | |
| 6,473,243 B1 * | 10/2002 | Omura | 359/730 |
| 6,496,306 B1 | 12/2002 | Shafer et al. | |
| 6,556,278 B1 | 4/2003 | Tanaka et al. | |
| 6,707,616 B1 | 3/2004 | Takahashi et al. | |
| 2002/0163733 A1 | 11/2002 | Takahashi | |
| 2003/0021040 A1 | 1/2003 | Epple et al. | |
| 2003/0039028 A1 | 2/2003 | Oskotsky et al. | |
| 2007/0268474 A1 * | 11/2007 | Omura et al. | 355/67 |
| 2008/0068724 A1 * | 3/2008 | Omura et al. | 359/665 |

FOREIGN PATENT DOCUMENTS

| | | |
|---|---|---|
| DE | 197 26 058 A1 | 1/1998 |
| EP | 0 604 093 B1 | 6/1994 |
| EP | 0 643 335 A1 | 3/1995 |
| EP | 0 736 789 A2 | 10/1996 |
| EP | 0 770 895 A2 | 5/1997 |
| EP | 0 869 383 A2 | 10/1998 |
| EP | 1 115 019 A2 | 7/2001 |
| EP | 1 191 378 A1 | 3/2002 |
| EP | 1 336 887 A1 | 8/2003 |
| EP | 1 367 444 A2 | 12/2003 |
| EP | 1 426 825 A2 | 6/2004 |
| EP | 1 630 585 A1 | 3/2006 |
| JP | 10-10429 | 1/1989 |
| JP | 09312254 A * | 12/1997 |
| JP | 2002-372668 | 12/2002 |
| WO | WO 99/52004 | 10/1999 |
| WO | WO 03/036361 A1 | 5/2003 |
| WO | WO 03/050587 A3 | 6/2003 |
| WO | WO 2004/107011 A1 | 12/2004 |

OTHER PUBLICATIONS

Erhard Glatzel, "New Lenses for Microlithography," Zeiss-Inform., 1981/1982, pp. 8-13, vol. 26, No. 92E, Oberkochen, Germany.

* cited by examiner

CATADIOPTRIC PROJECTION OBJECTIVE WITH GEOMETRIC BEAM SPLITTING

CROSS REFERENCE TO RELATED APPLICATIONS

This application is a Divisional of application Ser. No. 10/734,623, filed Dec. 15, 2003, now U.S. Pat. No. 6,995,930, which is a Continuation-in-Part of application Ser. No. 09/751,352, filed Dec. 27, 2000, now U.S. Pat. No. 6,665,126, which claims the benefit of Provisional Application No. 60/173,523, filed Dec. 29, 1999, and of Provisional Application No. 60/222,798, filed Aug. 2, 2000; the Continuation-in-Part application Ser. No. 10/734,623 (which is incorporated herein in its entirety by reference) additionally claims the benefit of Provisional Application No. 60/511,673, filed Oct. 17, 2003.

BACKGROUND OF THE INVENTION

1. Field of the Invention

The invention relates to a catadioptric projection objective for projecting a pattern arranged in an object plane of the projection objective into an image plane of the projection objective with the formation of at least one real intermediate image at an image-side numerical aperture NA>0.7.

2. Description of the Related Prior Art

Projection objectives of this type are used in microlithography projection exposure systems for producing semiconductor components and other finely structured components. They are used to project patterns of photo masks or engraved plates, which in the following text will generally be designated masks or reticles, onto an object coated with a light-sensitive layer, with extremely high resolution on a reducing scale.

In this case, in order to generate finer and finer structures, it is necessary, firstly, to enlarge the image-side numerical aperture NA of the projection objective and, secondly, to use shorter and shorter wavelengths, preferably ultraviolet light with wavelengths of less than about 260 nm, for example 248 nm, 193 nm or 157 nm.

For wavelengths down to 193 nm, it is possible to operate with purely refractive (dioptric) projection systems, whose production can be managed easily because of their rotational symmetry about the optical axis. In order to achieve extremely small resolutions, however, it is necessary here to operate with extremely large numerical apertures NA of more than 0.8 or 0.9. In the case of dry systems with an adequately large, finite working distance (distance between the exit face of the objective and the image plane), these can be implemented only with difficulty. Refractive immersion systems have also already been proposed which, by using an immersion liquid of high refractive index between objective exit and image plane, permit values of NA>1.

For the aforementioned short wavelengths, however, it becomes more and more difficult to provide purely refractive systems with adequate correction of color errors (chromatic aberration), since the Abbé constants of suitable transparent materials are relatively close to one another. Therefore, for extremely high resolution projection objectives, use is predominantly made of catadioptric systems, in which refractive and reflective components, in particular therefore lenses and refractive mirrors, are combined.

When using projecting reflecting surfaces, it is necessary to use beam deflection devices if obscuration-free and vignetting-free projection is to be obtained. Both systems with geometric beam splitting by means of one or more wholly reflecting folding mirrors (deflection mirrors) and systems with physical beam splitting are known. Furthermore, planar mirrors can be used for folding the beam path. These are generally used in order to meet specific installation space requirements or in order to align the object and image plane parallel to each other. These folding mirrors are optically not absolutely necessary.

The use of a physical beam splitter, for example in the form of a beam splitter cube (BSC), with polarization-selective beam splitter surface makes it possible to implement projection objectives with an object field centered on the optical axis (one-axis systems). The disadvantage with such systems is that suitable transparent materials for the production of a beam splitter cube are available only to a limited extent in the required large volumes. In addition, the production of the polarization-selectively effective beam splitter layers presents considerable difficulties. An incomplete polarization-selective action can lead to the production of leakage transmission dependent on the angle of incidence and therefore to intensity inhomogeneities in the projection.

The disadvantage of systems with polarization-selective beam splitters can largely be avoided in systems with geometric beam splitting, that is to say when wholly reflective folding mirrors are used in the beam deflection device. Such a folding mirror permits the optical path leading to a concave mirror to be separated physically from the optical path leading away from the concave mirror. Many problems which can result from the use of polarised light are eliminated.

In the case of projection objectives with geometric beam splitting, various folding geometries are possible, there being specific advantages and disadvantages, depending on the course of the light path between object field and image field.

U.S. Pat. No. 6,195,213 B1 shows various embodiments of projection objectives with geometric beam splitting for projecting a pattern of a mask arranged in an object plane of the projection objective into an image plane of the projection objective with the formation of a single, real intermediate image. The projection objectives, which reach image-side numerical apertures up to NA=0.75, have a catadioptric first objective part, which is arranged between the object plane and the image plane and has a concave mirror and a beam deflection device, and also a dioptric second objective part, which is arranged between the first objective part and the object plane. The elements of the first objective part used for forming the intermediate image are designed in such a way that the intermediate image lies optically and geometrically in the vicinity of the first folding mirror. The beam deflection device has a first folding mirror, which is arranged in the beam path between the concave mirror and the image plane. In these systems, the first folding mirror is arranged in such a way that light coming from the object plane falls firstly on the concave mirror of the first objective part before it is reflected by the latter to the first folding mirror. From the latter, it is deflected by 90° and reflected to a second folding mirror, which deflects the radiation coming from the first folding mirror once more through 90° in the direction of the image plane. This beam guidance leads to an h-shaped structure of the system, for which reason this folding geometry is also designated h-folding. The projection objective has only one concave mirror.

Accommodated in the space between object plane and first folding mirror are a plurality of lenses used for the optical correction. The region between the folding mirrors is free of lenses, which is intended to permit a compact design. Therefore all the lenses and the concave mirror are arranged in objective parts which can be aligned vertically, which is intended to achieve a structure which is stable with respect to the influences of gravity.

In U.S. Pat. No. 5,969,882 (corresponding to EP-A-0 869 383), other projection objectives with h-folding and only one concave mirror are described, in which lenses are arranged in the space between object plane and first folding mirror. In embodiments in which the first and the second folding mirror are configured as reflective surfaces of a deflection prism, the region between the folding mirrors is free of any refractive power.

European Patent EP 0 604 093 B1 and U.S. Pat. No. 5,668, 673 connected thereto via a common priority show catadioptric projection objectives with relatively low numerical apertures of NA≦0.5, in which the object field is projected into the image field with the aid of two concave mirrors, forming a single real intermediate image. Embodiments with different, partly complex folding geometries are shown, in some embodiments a first beam section running from the object plane to a concave mirror and a second beam section running from this concave mirror to the image plane crossing. The complex folding geometries with a large number of optical components physically close to one another mean that considerable mechanical and mounting problems may be expected in the practical implementation of such designs. A transfer of the design concepts into the area of higher numerical apertures appears not to be practical, on account of the associated greater maximum beam diameters and the correspondingly increasing maximum lens diameters.

European Patent EP 0 989 434 (corresponding to U.S. Pat. No. 6,496,306) shows projection objectives with a beam deflection device formed as a mirror prism. The mirror prism forms the first folding mirror for the deflection of the radiation coming from the object plane to the concave mirror, and a second folding mirror for the deflection of the radiation reflected from the concave mirror to the second objective part, which contains only refractive elements. The catadioptric first objective part forms a real intermediate image, which is located freely accessibly at a distance behind the second reflecting surface. The single concave mirror is fitted in a side arm of the projection objective which projects transversely with respect to the vertical direction when installed and which is also designated a "horizontal arm" (HOA). On account of the 1-form geometry of the beam path, such a folding geometry is also designated "1-folding". Other projection objectives with only one concave mirror and 1-folding are described, for example, in DE 101 27 227 (corresponding to US Patent Application US 2003/021040) or the International Patent Application WO 03/050587.

Systems with geometric beam splitters have the disadvantage, caused by the principle, that the object field is arranged eccentrically with respect to the optical axis (extra-axial system or off-axis system). This places high requirements on the correction of image errors since, in such a projection system, as compared with on-axis systems, a larger usable field diameter has to be corrected adequately with the same object field size. This larger field area, including the object field, will also be designated the "superfield" in the following text.

Optimization of the size of the superfield becomes more and more difficult as the numerical aperture of the projection objective increases, since the clearances for the arrangement and dimensioning of optical components and here, in particular, the folding mirror, become smaller and smaller, with the limiting condition of vignetting-free projection. In addition, the mechanical mounting of the optical components increasingly presents difficulties the more complex their relative arrangement to one another is.

SUMMARY OF THE INVENTION

It is an object of the invention to provide catadioptric projection objectives which, with a finite working distance, permit a higher projection quality, even at extremely high numerical apertures. In this case, a beneficial geometry for stable mounting of optical components is to be achieved. In particular, an increase in the image-side numerical aperture in regions of NA≧0.8 or NA≧0.9 is to be made possible which, when such projection objectives are used in immersion lithography or in near field lithography, permit usable numerical apertures of NA≧1.

As an achievement of this object, according to one formulation of the invention, the invention provides a catadioptric projection objective for projecting a pattern arranged in an object plane of the projection objective into an image plane of the projection objective, in which at least one real intermediate image is formed during the projection and an image-side numerical aperture of NA>0.7 is achieved. The projection objective comprises:

an optical axis; and at least one catadioptric objective part that comprises a concave mirror and a first folding mirror;

wherein a first beam section running from the object plane to the concave mirror and a second beam section running from the concave mirror to the image plane can be generated;

and the first folding mirror is arranged with reference to the concave mirror in such a way that one of the beam sections is folded at the first folding mirror and the other beam section passes the first folding mirror without vignetting, and the first beam section and the second beam section cross one another in a cross-over region.

The crossed beam guidance in the region of the catadioptric objective part permits projection objectives with a compact and mechanically stable arrangement of the optical components. In this case, vignetting-free beam guidance can be achieved, so that no folding mirror cuts a beam which is reflected either at the folding mirror or is led past the folding mirror without reflection. In this way, only the system aperture stop limits, in an axially symmetrical way, the angular distribution of the beams which contribute to the imaging. At the same time, even at extremely high numerical apertures, which are associated with large maximum beam diameters and possibly highly convergent or divergent beams in the region of field planes, a moderate size of the superfield to be corrected can be achieved.

The invention can be used in different folding geometries. In some embodiments, the first folding mirror is arranged such that the first beam section is folded at the first folding mirror and the second beam section passes the first folding mirror without vignetting. In this case, the first folding mirror typically has a reflecting surface facing away from the optical axis. This beam guidance, in which the radiation running indirectly or directly from the object plane to the catadioptric objective part strikes the first folding mirror first, is typical of objectives with the 1-folding mentioned at the beginning.

In other embodiments, the first folding mirror is arranged such that the first beam section, that is to say the radiation coming directly or indirectly from the object plane, passes the first folding mirror without vignetting and the second beam section, that is to say the radiation reflected by the concave mirror, is folded at the first folding mirror. Here, the first folding mirror can have a reflecting surface facing the optical axis, so that the radiation on the path from the concave mirror to objective parts arranged downstream and to the image plane crosses the optical axis and the first beam section. This beam guidance is typical of the h-designs mentioned at the beginning.

In many advantageous embodiments, the projection objective has only a single concave mirror. However, embodiments with more than one concave mirror are also possible. Such embodiments can contain a plurality of catadioptric objective parts, of which one or more can have the crossed beam guidance.

It may be beneficial if the projection objective has at least one second folding mirror in addition to the first folding mirror. Additional folding mirrors can be used for the purpose of aligning object plane and image plane parallel to each other. Additional folding mirrors are also required when further catadioptric objective parts with geometric beam splitting are provided. Within the scope of the invention, there are embodiments with one or more catadioptric objective parts.

The first and the second folding mirrors can be fitted to a common carrier. The first and the second folding mirrors are preferably separate folding mirrors, which are mounted in separate mounts and, if appropriate, can be set or adjusted separately from one another. The folding mirrors can be fitted on different sides of the optical axis. The folding mirrors can be fixed stably on mutually opposite sides of the mount construction of the projection objective with the aid of compact fixing constructions. A separate mounting of the folding mirrors can also be advantageous with regard to the fact that, as a rule, only one of the mirror edges is critical with regard to the vignetting of the beam. These can be positioned beneficially given separate mounting of folding mirrors.

Projection objectives according to the invention can have one or more real intermediate images. In the region of an intermediate image there exists a local minimum of the beam diameter, so that it is generally beneficial to fit a folding mirror geometrically and/or optically in the vicinity of an intermediate image. In one embodiment, the first folding mirror has an inner mirror edge near the optical axis and an intermediate image is arranged in the geometric vicinity of the inner mirror edge. The intermediate image can be the single intermediate image of the projection objective, which preferably has a beam folding geometry typical of 1-folding. The geometric distance between the intermediate image and the inner mirror edge is preferably less than 30% or less than 20% or less than 10% of the meridional extent of the intermediate image.

In some embodiments, in particular in embodiments with 1-folding, the first folding mirror has an inner mirror edge near the optical axis, and an intermediate image is arranged in a geometric space between the inner mirror edge and the object plane. In these embodiments, it is possible for the beam to be "forced through" between the first folding mirror and the field plane placed geometrically upstream of the latter and/or an optical component placed geometrically upstream of the folding mirror without vignetting.

In some embodiments, the upstream field plane is the object plane. In other embodiments, one or more refractive and/or catadioptric projection systems can be connected upstream of the catadioptric objective part which has the crossed beam guidance, so that the upstream field plane is an intermediate image plane of the projection objective.

It can be beneficial if the at least one intermediate image is arranged in the optical vicinity of a folding mirror. An optical vicinity of a folding mirror is characterized in particular by the fact that neither lens nor any optical element is arranged between the intermediate image and the most closely situated folding mirror. Sometimes, an intermediate image is arranged in the optical vicinity of a second folding mirror, not necessary for the beam separation. An arrangement of an intermediate image such that at least part of the intermediate image falls on a reflecting surface of a folding mirror should be avoided, on the other hand, since this can lead to errors which may be present in the reflecting surface being projected sharply into the image plane. A spacing between intermediate image and reflecting surface is therefore advantageous.

One class of projection objectives according to the invention has only a single real intermediate image as well as a single concave mirror and two folding mirrors, which are aligned for parallel alignment of object plane and image plane. In this case, both h-folding and 1-folding are possible.

Other embodiments have two or more real intermediate images, in particular at least three real intermediate images. Embodiments having at least three real intermediate images have a first objective part for projecting the object field into a first real intermediate image, a second objective part for forming a second real intermediate image with the radiation coming from the first objective part, a third objective part for forming a third real intermediate image from the radiation coming from the second objective part, and a fourth objective part for projecting the third real intermediate image into the image plane.

In preferred systems, the third intermediate image is projected into the image plane directly, that is to say without the formation of further intermediate images, so that there are precisely three real intermediate images.

The first objective part can serve as a relay system, in order to form a first intermediate image with a predefinable correction state at a suitable position from the radiation coming from the object plane.

At least two of the objective parts are preferably catadioptric and in each case have a concave mirror. In particular, precisely two catadioptric objective parts can be provided.

In one development, the second objective part and the third objective part are constructed with one concave mirror in each case. Each of the concave mirrors is assigned a folding mirror, in order either to deflect the radiation to the concave mirror or to deflect the radiation coming from the concave mirror in the direction of a following objective part.

The fourth objective part is preferably purely refractive and can be optimized in order to produce high image-side numerical apertures (NA).

Preferred embodiments comprise four objective parts, which are grouped in a cross-like arrangement wherein, at one or more points of the complexly folded beam path, crossover regions can arise in which the first beam section running from the object plane to a concave mirror and the second beam section running from the concave mirror to the image plane cross one another.

The provision of at least two catadioptric subsystems has great advantages. In order to see substantial disadvantages of systems with only one catadioptric subsystem, it is necessary to consider how, in a catadioptric objective part, the correction of the Petzval sum and of the chromatic aberrations is carried out. The contribution of a lens to the longitudinal chromatic aberration CHL is given by $$CHL \propto h^2 \cdot \phi \cdot \nu$$

that is to say it is proportional to the marginal beam height h (as the square), the refractive power $\phi$ of the lens and the dispersion $\nu$ of the material. On the other hand, the contribution of a surface to the Petzval sum depends only on the surface curvature and the refractive index step (which is $-2$ in the case of a mirror).

In order to allow the contribution of the catadioptric group to the chromatic correction to become large, large marginal beam heights are therefore needed (that is to say large diameters); in order to allow the contribution to the Petzval correction to become large, large curvatures (that is to say small radii, which are most expediently achieved with small diameters). These two requirements oppose each other.

The opposing requirements for Petzval correction (that is to say correction to the curvature of the image field) and chromatic correction can be solved by the introduction of (at least) a further catadioptric part into the system.

The two catadioptric systems can be designed asymmetrically in such a way that one has a trend to a large diameter with flat radii for CHL correction and the other has a trend to a small diameter with curved radii for Petzval correction. A symmetrical structure is likewise possible and can be beneficial from the point of view of simple fabrication.

In general, the degree of freedom consists in distributing the correction of these and other image errors uniformly or nonuniformly to two (or more) catadioptric subsystems. In this way, with a structure on which the requirements are relaxed, extremely high apertures with an excellent state of correction can be implemented.

The invention makes it possible to provide catadioptric projection objectives in which, even at extremely high numerical apertures, the geometric optical conductance to be corrected does not become too high. The geometric optical conductance (or etendue) is defined here as the product of the image-side numerical aperture and the field size. In some embodiments, a diagonal ratio between the length of the diagonal of a minimum circle centered on the optical axis and enclosing the object field (superfield diagonal) and the length of a diagonal of the object field is less than 1.5, in particular less than 1.4 or less than 1.3 or less than 1.2.

The invention makes it possible to provide easily correctable catadioptric projection objectives which, with a compact design and mechanically stable structure, can achieve extremely high numerical apertures. There are embodiments which are designed as "dry objectives". Dry objectives are distinguished by the fact that they are designed for the purpose in which, between the exit side of the projection objective and an input coupling surface of an object to be exposed, for example a wafer, there is in operation a gap which is filled with gas and whose gap width is typically considerably larger than the working wavelength. In such systems, the numerical apertures that can be achieved are restricted to values NA<1 since, as the value NA=1 is approached, total reflection conditions occur at the exit face, which prevent illuminating light being coupled out of the exit face. The image-side numerical aperture in preferred embodiments of dry systems is NA>0.8, even NA$\geq$0.85 or NA$\geq$0.9 being possible.

Within the scope of the invention, catadioptric projection objectives which are designed as immersion objectives are also possible. In the case of immersion lithography, as is known, the achievable resolution of an exposure process is improved by the fact that an immersion medium with high refractive index is introduced into the space between the last optical element of the projection objective and the substrate, for example an immersion liquid which has a refractive index $n_I \geq 1.3$ at the working wavelength. As a result, projection objectives or projections with an image-side numerical aperture NA>1.0 are possible, preferably NA$\geq$1.1 or NA$\geq$1.2 or NA$\geq$1.3 being possible.

The optical structure also permits use for non-contact near-field projection lithography. In this case, coupling of sufficient light energy into the substrate to be exposed via a gap filled with the gas is possible if a sufficiently low image-side working distance is maintained on average over time. This distance should lie below four times the working wavelength used, in particular below the working wavelength. It is particularly beneficial if the working distance is less than half the working wavelength, preferably less than one third, one quarter or one fifth of the working wavelength. At these short working distances, projection in the optical near field can be carried out, in which evanescent fields, which exist in the immediate facility of the last optical face of the projection system, are used for the projection.

The invention therefore also comprises a non-contact projection exposure method in which evanescent fields of the exposure light, which are found in the immediate vicinity of the exit face, are made useful to the lithographic process. In this case, at sufficiently low (finite) working distances, in spite of geometric total reflection conditions at the last optical face of the projection objective, a proportion of light that can be used for lithography is coupled out of the exit face of the objective and coupled into an input coupling surface immediately adjacent at a distance.

Embodiments for non-contact near field projection lithography have preferably typical working distances in the range of the working wavelength or less, for example between about 3 nm and about 200 nm, in particular between about 5 nm and about 100 nm. The working distance should be matched to the other properties of the projection system (properties of the projection objective close to the exit face, properties of the substrate close to the input coupling surface) such that, on average over time, an input coupling efficiency of at least 10% is achieved.

Within the scope of the invention, a method for producing semiconductor components and the like is thus possible, in which a finite working distance between an exit face for exposure light assigned to the projection objective and an input coupling surface for exposure light assigned to the substrate is set, the working distance being set within an exposure time interval at least temporarily to a value which is smaller than a maximum extent of an optical near field of the light emerging from the exit face.

The above and further features also emerge from the description and from the drawings, as well as from the claims, it being possible for the individual features, in each case on their own or in a plurality, to be implemented in the form of sub-combinations in an embodiment of the invention and in other fields and for them to represent embodiments that are advantageous and intrinsically capable of protection.

DETAILED DESCRIPTION OF PREFERRED EMBODIMENTS

In the following description of preferred embodiments, the term "optical axis" designates a straight line or a series of straight line sections through the centers of curvature of the optical components. The optical axis is folded at folding mirrors (deflection mirrors) or other reflective surfaces. Directions and distances will be described as "image-side" if they are oriented in the direction of the image plane or of the substrate to be exposed and located there, and as "object-side" if they are oriented toward the object plane or a reticle located there with reference to the optical axis. In the examples, the object is a mask (reticle) having a pattern of an integrated circuit, it can also be another pattern, for example a grating. In the examples, the image is projected onto a wafer provided with a photoresist layer which acts as a substrate; other substrates, for example elements for liquid crystal displays or substrates for optical gratings, are also possible.

Figure 1:
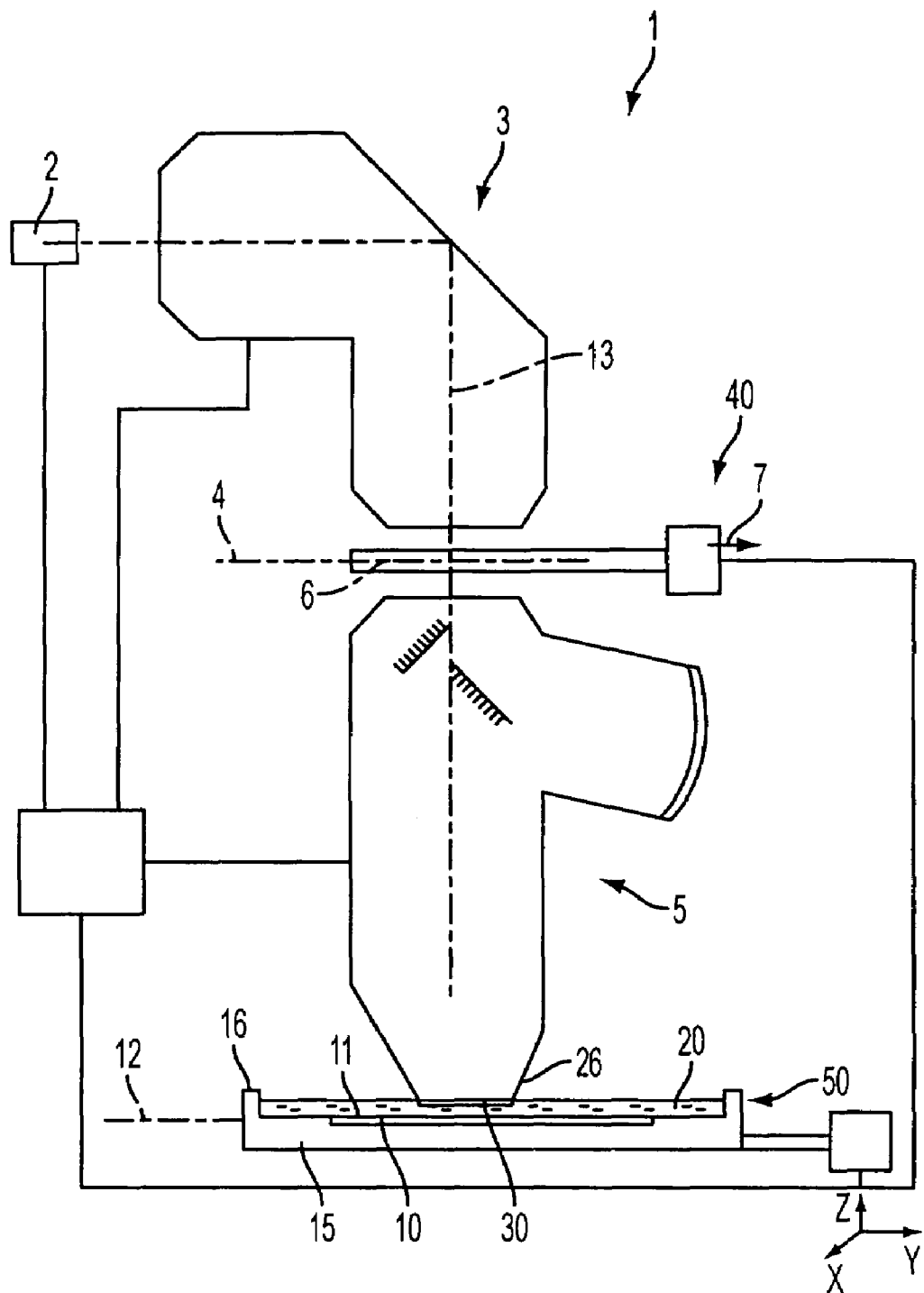
FIG. 1 shows a schematic representation of a projection exposure system for immersion lithography with an embodiment of a catadioptric projection objective according to the invention.

In FIG. 1, a micro lithographic projection exposure machine in the form of a wafer stepper 1, which is provided for the production of highly integrated semiconductor components by means of immersion lithography, is shown schematically. The projection exposure machine 1 comprises, as light source, an excimer laser 2 having a working wavelength of 193 nm, other working wavelengths, for example 157 nm or 248 nm, also being possible. An illumination system 3 connected downstream produces in its exit plane 4 a large, sharply delimited, very homogeneously illuminated illumination field matched to the telecentering requirements of the projection objective 5 connected downstream. The illumination system 3 has devices for selecting the illuminating mode and, in the example, can be switched over between conventional illumination at a variable level of coherence, annular field illumination and dipole or quadrupole illumination.

Arranged behind the illumination system is a device 40 (reticle stage) for holding and manipulating a mask 6 such that the latter lies in the object plane 4 of the projection objective 5 and can be moved in this plane in a removal direction 7 (y direction) for scanning operation.

Behind the plane 4, also designated the mask plane, there follows the catadioptric reduction objective 5, which projects an image of the mask with a reduced scale of 4:1 onto a wafer 10 covered with a photoresist layer. Other reduction scales, for example 5:1 or 10:1 or 100:1 or less are likewise possible. The wafer 10 serving as light-sensitive substrate is arranged such that the flat substrate surface 11 with the photoresist layer substantially coincides with the image plane 12 of the projection objective 5. The wafer is held by a device 50 (wafer stage), which comprises a scanner drive in order to move the wafer synchronously with the mask 6 and parallel to the latter. The device 50 also comprises manipulators in order to move the wafer both in the z direction parallel to the optical axis 13 of the projection objective and in the x and y direction at right angles to this axis. A tilting device having at least one tilt axis running at right angles to the optical axis 13 is integrated.

The device 50 provided for holding the wafer 10 is constructed for use in immersion lithography. It comprises a holding device 15 which can be moved by a scanner drive and whose base has a flat recess to hold the wafer 10. By means of a circumferential edge 16, a flat liquid-tight holder that is open at the top is formed for a liquid immersion medium 20, which can be introduced into the holder by devices not shown and can be led away from said holder. The height of the edge is dimensioned such that the immersion medium put in can cover the surface 11 of the wafer 10 completely and, when the working distance between the objective exit and wafer surface is set correctly, the exit-side end region of the projection objective 5 can dip into the immersion liquid.

Figure 2:
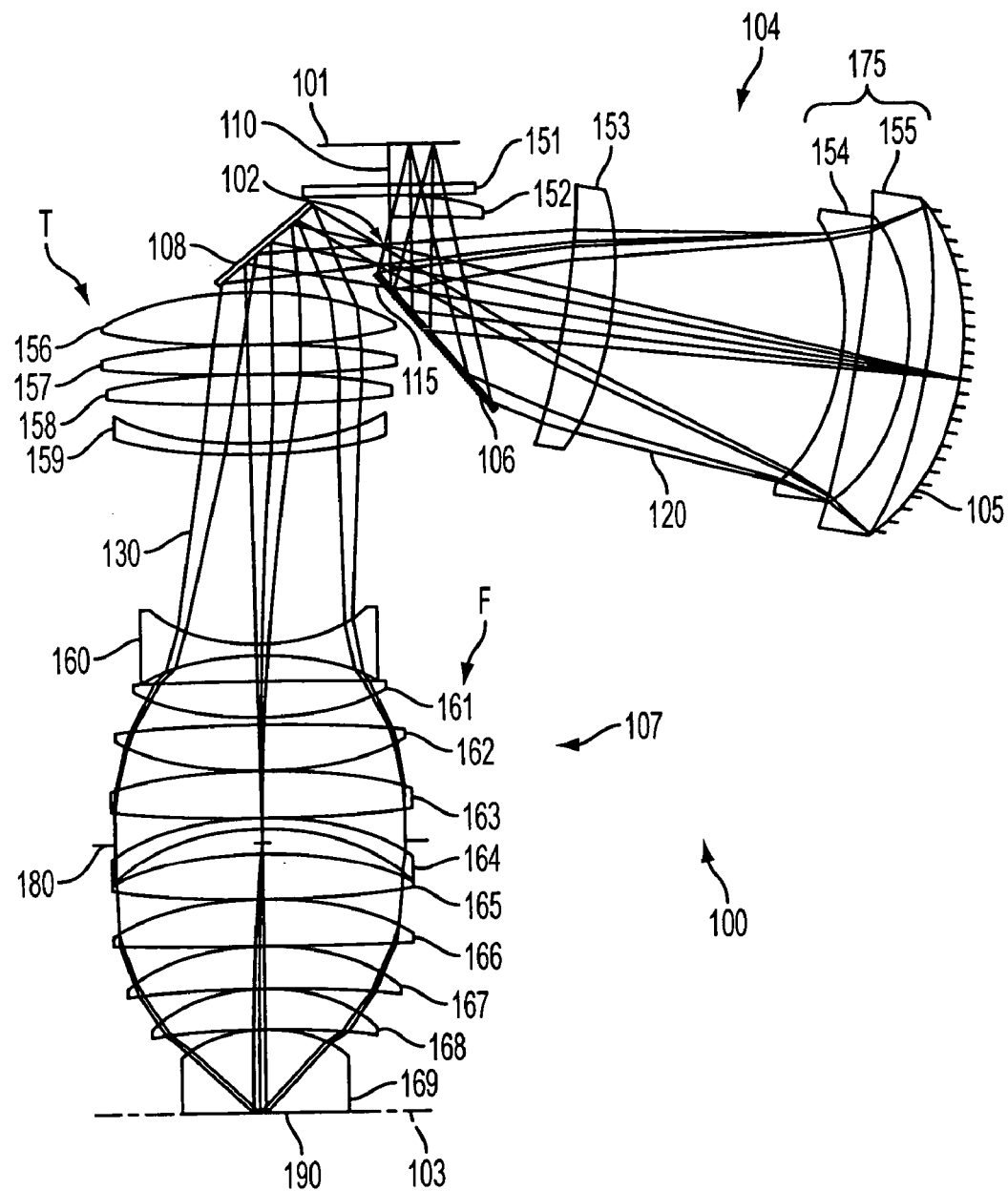
FIG. 2 is a lens section through a first embodiment of a catadioptric immersion objective according to the invention with geometric beam splitter and 1-folding.

FIG. 2 shows the first embodiment of a catadioptric reduction objective 100 designed for immersion lithography and having geometric beam splitting. It is used to project a pattern of a reticle or the like arranged in its object plane 101 into an image plane 103 aligned parallel to the object plane on a reduced scale, for example in the ratio 4:1, with the formation of a single real intermediate image 102. Between the object plane 101 and the image plane 103, the objective has a catadioptric objective part 104, which comprises a concave mirror 105 and a first, flat folding mirror 106, and also a purely refractive dioptric objective part 107 following behind the catadioptric objective part in the light path. Between the intermediate image 102 and the first lens of the refractive objective part 107 there is arranged a second folding mirror 108, whose reflecting surface lies in a plane which is aligned at right angles to the plane of the reflective surface of the folding mirror 106. The first folding mirror 106 has a reflecting surface which predominantly faces away from the optical axis 110 and which is used to deflect the radiation coming from the object plane in the direction of the concave mirror 105. The second folding mirror 108, which is situated geometrically closer to the object plane 101 than the first folding mirror 106, is arranged and aligned such that it deflects the radiation coming from the concave mirror in the direction of the image plane 103. While the first folding mirror 106 is necessary for the beam deflection toward the concave mirror 105, the second folding mirror 108 can also be omitted. Then, without further deflection mirrors, the object plane and the image plane would be substantially at right angles to each other.

The first folding mirror 106 is inclined with respect to the optical axis 110 at an angle of inclination of about 40°, so that the side arm (horizontal arm, HOA) of the projection objective, bearing the concave mirror 105, is inclined at about 100° with respect to the parts of the optical axis that are at right angles to the object and image plane. This ensures that the region of the concave mirror does not project into the region of the devices provided to hold the reticle.

A first beam section 120 leads from the object plane 101 to the concave mirror 105 and is folded at the first folding mirror 106. A second beam section 130 leads from the concave mirror 105 to the image plane 103 and is folded at the second folding mirror 108. The intermediate image 102 is located in the immediate vicinity of the inner mirror edge 115, close to the optical axis 110 and facing the object plane 101, of the first folding mirror in the space between the inner mirror edge 115 and the reticle plane, beneficially in such a way that the beam of the second beam section, converging toward the intermediate image 102 and diverging again behind the latter, can pass through the first folding mirror without being cut. As can be seen from FIG. 2, in this case the minimum geometric distance between the inner mirror edge 115 and the beam in the region of the intermediate image is considerably smaller than the diameter of the intermediate image lying in the section plane of the illustration and is less than about 20% of this diameter. Since the projection scale of the first projection system comprising the catadioptric objective part, which forms the intermediate image, is close to β=1, this diameter corresponds substantially to the width of the object field in the removal direction or scanning direction 7 (y direction). From an optical point of view, the intermediate image 102 lies in the immediate vicinity of the second folding mirror 108, no lens being arranged between the intermediate image and the second folding mirror.

The projection objective 100 represents an advantageous variant of the 1-folding explained at the beginning, in which the intermediate image lies geometrically between the object plane or the reticle and the first folding mirror 106 and the beam deflection is carried out with the aid of two separate mirrors. Further below, it will be explained in more detail how, as a result of this unusual folding arrangement, the optical conductance to be corrected or the superfield size of the entire system can be kept small, even in the case of extremely high numerical apertures.

During operation of the projection system, the light from the illumination system enters the projection objective on the side of the object plane 101 facing away from the image and passes first of all through the mask arranged in the object plane. The transmitted light then passes through a plane-parallel entry plate 151 and a positive meniscus lens 152 with a concave surface on the image side, designed as a half-lens, arranged between said entry plate and the first folding mirror. Following deflection at the first folding mirror 106, a positive meniscus lens 153 arranged between folding mirror and concave mirror in the vicinity of the first folding mirror and having a spherical, concave entry face which is opposite the folding mirror and an aspherical exit face, is passed through before a mirror group 175 is reached. The mirror group 175 comprises two negative meniscus lenses 154, 155 which are placed immediately before the concave mirror 105 and whose convex or elevated surface in each case points toward the concave mirror 105, and the concave mirror 105 itself. The light reflected from a concave mirror 105 and led back through the lenses 155, 154 and 153, which are passed twice, then forms the real intermediate image 102 in the immediate vicinity of the mirror edge 115, facing the object, of the first folding mirror.

The lenses of the refractive objective part 107 can be subdivided functionally into a transfer group T and a focusing group F and are used jointly to project the intermediate image produced immediately in front of the second folding mirror 108 into the image plane 103 on a reduced scale. The transfer group comprises three biconvex positive lenses 156 to 158 following one another directly and a following negative meniscus lens 159 with an object-side concave face.

The focusing group, following at a distance, opens with a biconcave negative lens 160 with a highly negative refractive power, which effects a high amount of beam widening and, because of the high angle of incidence of the radiation on its exit side, contributes effectively to the correction of image errors. The three following positive lenses 161, 162, 163 having aspherical entry faces and spherical exit faces initiate the beam convergence. In the region of the system aperture stop 180 there is situated a negative meniscus 164 with an image-side concave face. This is followed by only positive lenses 165 to 169, which are substantially used to produce the high image-side numerical aperture. The last optical element before the image plane 103 is formed by a plane-convex lens 169, whose flat exit side is situated at a working distance of 2 mm in front of the image plane 103. In operation, the narrow opening is filled with an immersion medium 190. In the example, extremely pure water with a reflective index $n_f$=1.437 (193 nm) is used as immersion liquid.

The specification of the design is summarized in table 1 in tabular form. In this case, column 1 specifies the number of the refractive, reflective or otherwise distinguished face, column 2 the radius r of the face (in mm), column 3 the distance d, designated the thickness, from the face to the following face (in mm), column 4 the material of a component and column 5 the refractive index of the material of the component which follows the specified entry face. Column 6 shows the maximum usable half-diameter in mm. The overall length L of the objective between object and image plane is about 930 mm.

In the embodiment, nine of the faces, namely the faces 5, 8=19, 10=17, 12=14, 27, 33, 35, 37 and 47 are aspherical. Table 2 specifies the corresponding asphere data, the heights of the meniscuses of the aspherical faces being calculated in accordance with the following rule:

$$p(h)=[((1/r)h^2)/(1+SQRT(1-(1+K)(1/r)^2h^2)]+C1*h^4+C2*h^6+\ldots$$

Here, the reciprocal (1/r) specifies the radius of curvature of the face at the vertex of the face, and h the distance of a point on the face from the optical axis. Thus, p(h) specifies this meniscus height, that is to say the distance of the point of the face from the vertex of the face in the z direction, that is to say in the direction of the optical axis. The constants K, C1, C2, . . . are reproduced in table 2.

The immersion system 100 is designed for a working wavelength of about 193 nm, at which the synthetic quartz glass ($SiO_2$) used for all the lenses has a refractive index n=1.5602. It is matched to extremely pure water as immersion medium ($n_f$=1.4367 at 193 nm) and has an image-side working distance of 2 mm. The image-side numerical aperture NA is 1.1, the projection scale is 4:1. The system is designed for an image field with a size of 26×5.5 $mm^2$ and is doubly telecentric. The diagonal ratio between the length of a diagonal of a minimum circle centered on the optical axis and enclosing the object field and the length of a diagonal of the object field (cf. FIG. 3) is about 1.26.

Figure 3:
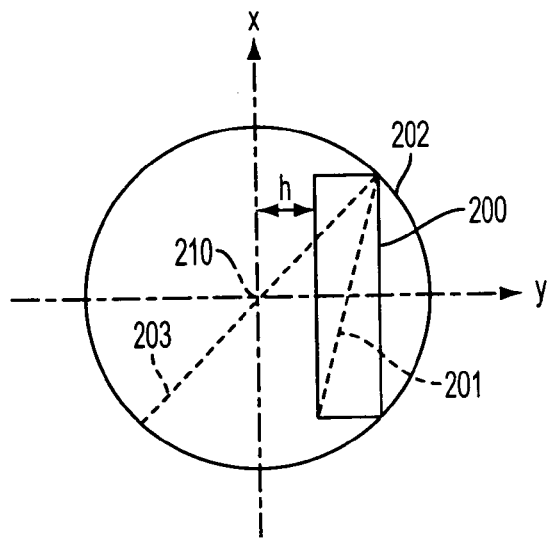
FIG. 3 is a schematic diagram which shows a rectangular object field arranged eccentrically in relation to the optical axis and a circular superfield to be corrected.

Some special features of the projection objective will be explained in more detail by using FIGS. 3 to 5. In this case, FIG. 3 shows a schematic representation of the dimensioning of object field and superfield in the object plane of the projection objective, FIG. 4 a folding geometry in the case of a projection objective according to the invention with a geometric beam splitter and 1-folding (cf. FIG. 2), and FIG. 5 a schematic representation of the beam course and the folding geometry in the case of a similar projection objective without a crossed beam path.

On account of the geometric beam splitting, the projection objective has an extra-axially arranged object field 200, there being a finite object field distance h between the optical axis 210 and the object field. The object field of the wafer scanner is rectangular or slot-like with a high aspect ratio and is identified by the length of its diagonal 201 (slot diagonal). In order to be able to project this extra-axial object field with little aberration, it is necessary to correct the projection objective for a field size which is considerably larger than the object field itself. This circular superfield 202 which is enclosed by a minimum circle about the eccentric object field centered around the optical axis 210, can be defined by the length of its diagonal 203, which is designated the superfield diagonal here. It can be seen by those skilled in the art that the diagonal ratio between the length of the superfield diagonal and the length of the slot diagonal should lie as close as possible to 1 in order to have the lowest possible effort on correction in the case of an extra-axial object field.

Figure 4:
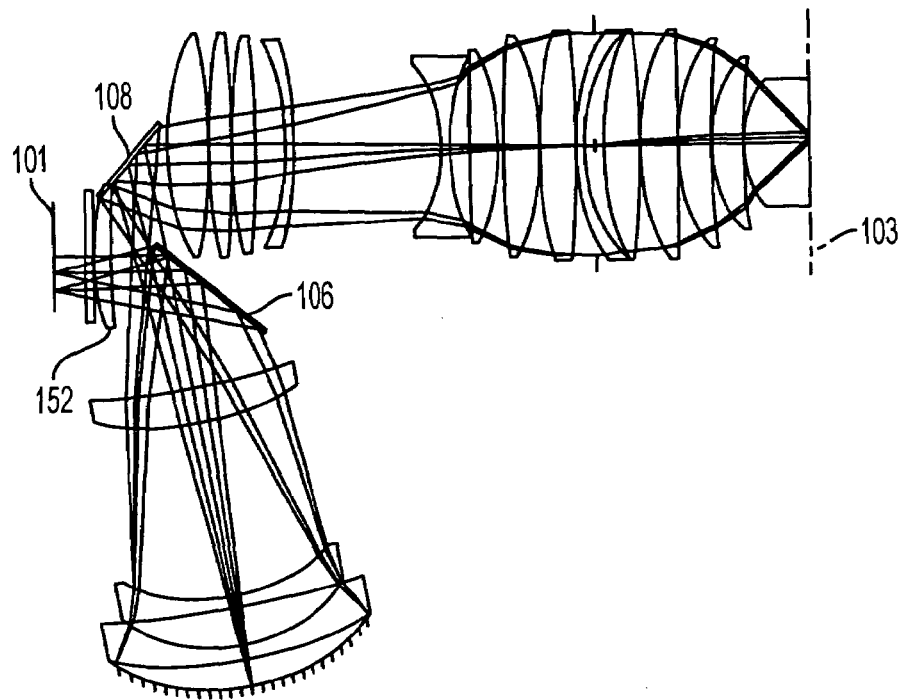
FIG. 4 shows the projection objective shown in FIG. 2 in an illustration suitable for comparison with FIG. 5.
Figure 5:
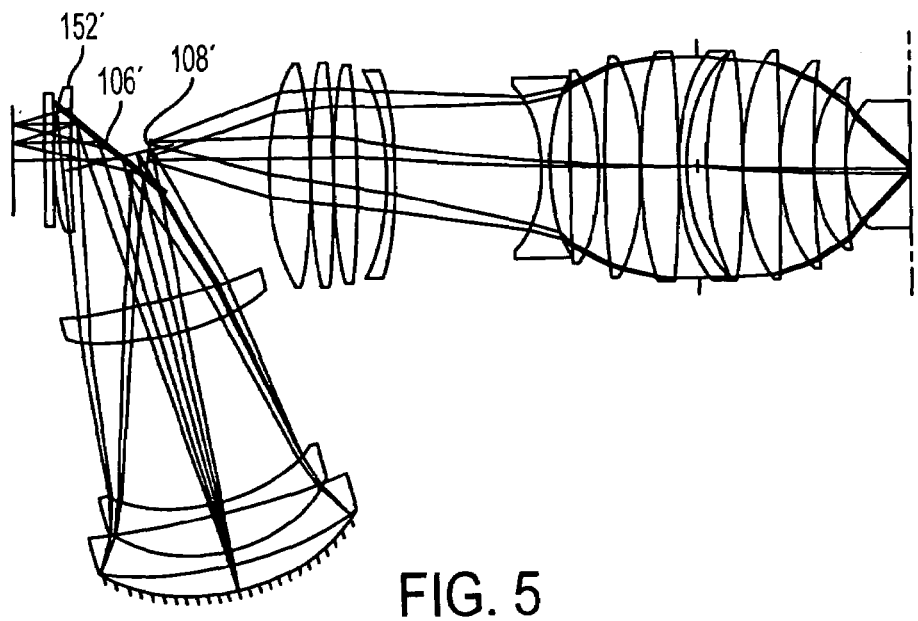
FIG. 5 shows a catadioptric projection objective with the same optical structure as in FIG. 4 but with a conventional geometric beam splitter.

By using FIGS. 4 and 5, the problem in minimizing the optical conductance and the superfield diameter and the problem of adequate space in the vicinity of the folding mirror will be explained by means of a comparison between conventional 1-folding with two folding mirrors fitted to a mirror prism (FIG. 5) and an embodiment according to the invention with separate folding mirrors (FIG. 4). In this case, FIG. 4 corresponds to the objective structure shown in FIG. 2. In both the folding variants illustrated, the field size is 26·5.5 mm². The same design is used as a basis (cf. table 1), that is to say the same object field radius is corrected. Thus, in both folding variants, the distance h of the object field from the optical axis (object field distance) is of the same size.

As a mechanical criterion for a comparison of the two folding variants, let it be assumed that the smallest distance of the edge of a lens from the object plane or reticle plane is to be sufficiently large in order to avoid any detrimental effect on the construction of the reticle stage. Both folding systems are conceived in such a way that this is provided in virtually the same way.

It can be seen that, in the variant shown in FIG. 4 with crossed beam guidance, the constructional-mechanical boundary condition can be met. For this purpose, it is merely necessary to design the first lens 152 following the object plane as a cut-off lens, in order that the second folding mirror 108 does not collide with this lens or its mount. This is shown in FIG. 2. It can be seen that no beam cutting or vignetting occurs at the folding mirrors 106, 108. In particular, the face of the first folding mirror 106 is sufficiently large that all of the radiation coming from the object can be deflected toward the concave mirror and the reflecting surface of the second folding mirror is sufficient to deflect the entire beam coming from the intermediate image in the direction of the image plane. The beam is not cut by the parts projecting into the beam path either, which contributes in particular to the fact that the region of minimum beam diameter in the vicinity of the intermediate image 102 can be forced through at a distance between the mirror edge closest to the reticle and the reticle.

In the case of conventional folding (FIG. 5), on the other hand, for vignetting-free deflection at the first folding mirror, it would be necessary for the latter to pass through the first lens 152'. This can be attributed, inter alia, to the fact that the first folding mirror 106 closest to the object plane is located on the same side as the extra-axial object field. This is precisely the opposite in the case of the folding according to FIG. 4, in which the folding mirror nearest to the object (the second folding mirror 108) is located on the side of the optical axis which is opposite the object field. It can further be seen in FIG. 5 that the light beams intersect in the vicinity of the tip of the prism which is formed by the mirror edges close to the axis and belonging to the first and second folding mirrors. This would also lead to vignetting and therefore cannot be implemented.

In order to eliminate the first conflict, it will be necessary for the first folding mirror 106 to be fitted further away from the reticle. However, this would enlarge the folding mirror, as a result of which the second conflict in the vicinity of the prism edge of the folding prism would become even more critical. As a consequence, the object field must be fitted further extra-axially and therefore (given an unchanged size of the superfield) can no longer have the full field size of 25·5.5 mm². It can be shown that, given the folding geometry shown in FIG. 5, only a field of a size of 16·5.5 mm² could be projected without vignetting, given the same corrected object field radius (that is to say given the same superfield size). Here, a great advantage of the beam guidance according to the invention is shown.

Figure 6:
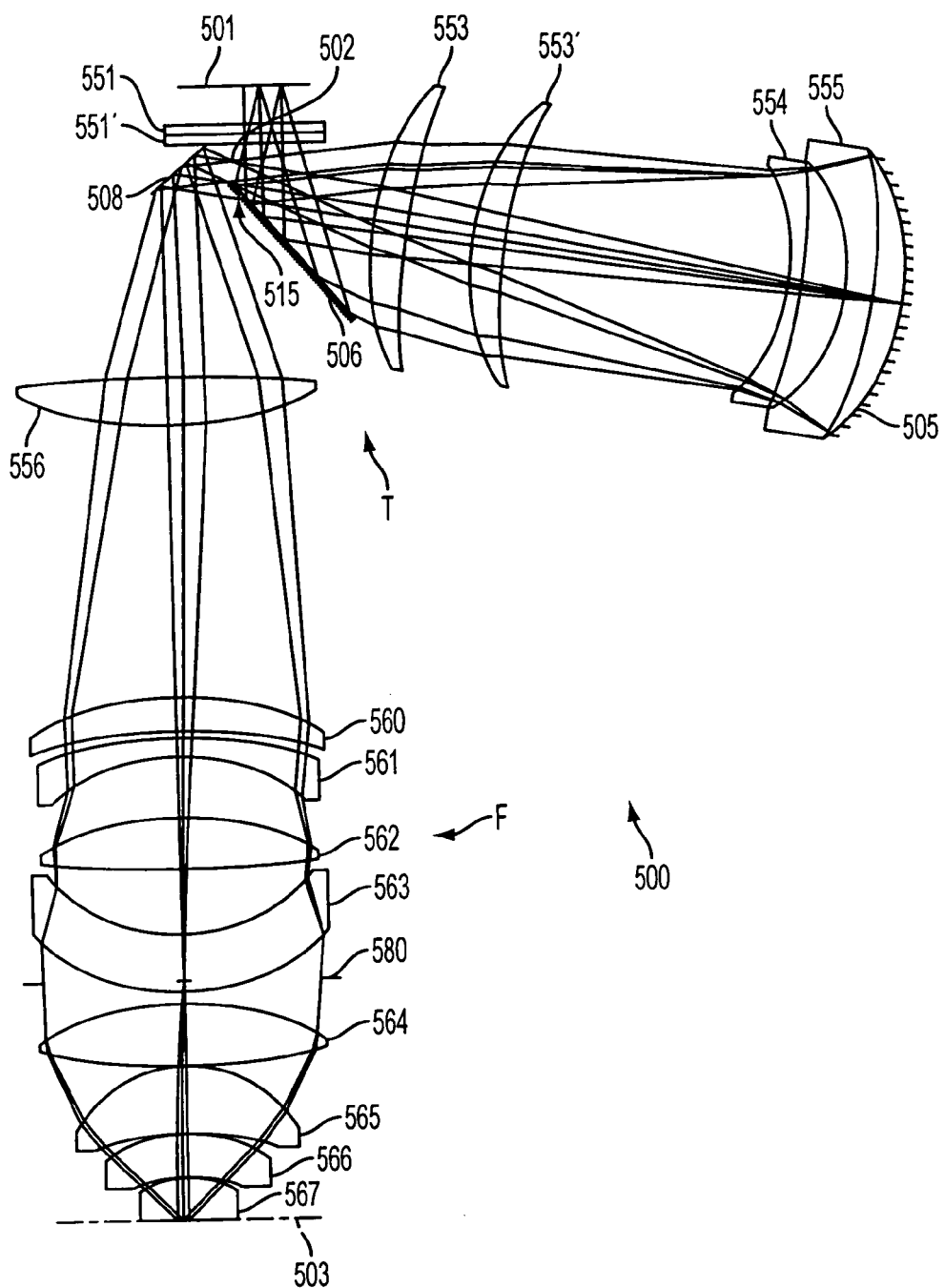
FIG. 6 shows a further embodiment of a catadioptric projection objective with a geometric beam splitter and 1-folding, which is designed for non-contact near field lithography.

A further embodiment of a catadioptric projection objective 500 with a geometric beam splitting, a single concave mirror and a crossed beam path in 1-folding geometry will be shown using FIG. 6. The basic structure is comparable with the embodiment of the projection objective 100 according to FIG. 2, for which reason the same designations, increased by 400, will be used for the corresponding features. The specification of the design emerges from tables 3 and 4.

As distinct from the embodiment according to FIG. 2, an aspheric lens with substantially no refractive power is arranged between the object plane 501 and the first folding mirror 506. The entry to the objective is formed by a plane-parallel plate 551 and the low refractive power asphere 551' following the latter. In the beam path, which is passed through twice, between the first folding mirror 506 and concave mirror 505, the positive refractive power in the vicinity of the intermediate image 502 is provided by two positive lenses 553, 553' which are arranged at a distance from each other and which jointly, with two negative meniscus lenses 554, 555 arranged in front of the concave mirror, contribute to positioning the intermediate image 502 between the mirror edge 515, facing the object, of the first folding mirror and the object plane. Optically immediately behind the intermediate image, the second folding mirror 508 is located, which can be small on account of the proximity to the intermediate image and can therefore be moved closer to the object plane. The function of the transfer group T is fulfilled by a single positive lens 556. The focusing group F has, in front of the system aperture stop 580, a positive meniscus 560 and a negative meniscus 561 (in each case with an image-side concave face), a biconvex positive lens 562 and an object-side concave meniscus 563 with a low refractive power immediately in front of the system aperture stop. Arranged between the latter and the image plane 503 are only positive lenses 564 to 567, the last of which is a planoconvex lens with a flat exit side. The image-side working distance between the flat exit face and the image plane is set to the value 0. In this design, the projection objective can be used for contact projection lithography by means of "solid immersion". With slight modifications, it can be changed into an immersion system with a finite working distance, whose region would have to be filled with an immersion medium. If the working distance is set, for example, to less than 100 nm and therefore only a fraction of the working wavelength, then this projection system can be adapted to a use in near field lithography, in which evanescent fields emerging from the exit side of the objective can be used for imaging.

Figure 7:
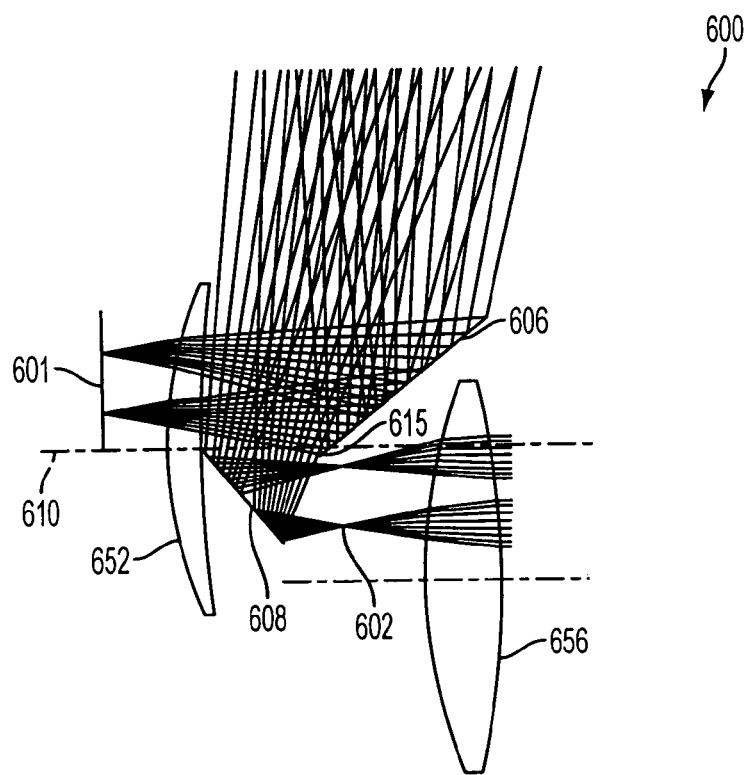
FIG. 7 shows a detailed view of the region of folding mirrors of another embodiment of a catadioptric projection objective according to the invention with geometric beam splitting.

In FIG. 7, the region of the twofold beam folding and crossed beam guidance of a catadioptric projection objective 600 having a single concave mirror and 1-folding is shown. Corresponding elements bear the same designations as in FIG. 2, increased by 500. As in the preceding embodiments, the radiation coming from the object plane 601 firstly strikes the first folding mirror 606, which deflects the radiation away from the optical axis 610 in the direction of the concave mirror (not shown), which reflects the radiation toward the second folding mirror 608. The optical components serving to form the intermediate image 602, which also include a positive lens 652 arranged in the space between object plane and first folding mirror, are designed such that the intermediate image is located in the direction in which the light runs behind the second folding mirror 608, in front of the first lens 656 of the refractive second objective part. The geometric distance of the intermediate image to the inner edge 615, facing the axis, of the first folding mirror, as in the embodiments according to FIG. 2, is only a fraction of about 20-30% of the meridonal extent of the intermediate image, so that there is high geometric proximity. As distinct from the previous embodiments, the intermediate image is not arranged in the space between the critical mirror edge 615 and the object plane, however, but approximately at the axial height of the inner mirror edge 615, beside the latter. The crossed beam guidance of the first beam section (between object plane 601 and concave mirror) and of the second beam section (between concave mirror and image plane) with a cross-over region geometrically between the positive lens 652 and the first folding mirror 606, in conjunction with the proximity of the intermediate image to the critical mirror edge 615, permits a high image-side numerical aperture which, in the example, is NA=0.8. The specification of this design in detail can be taken from the European patent Application EP 1 115 019 A2, whose disclosure content is made the content of this description by reference (cf. FIG. 11 there).

Figure 8:
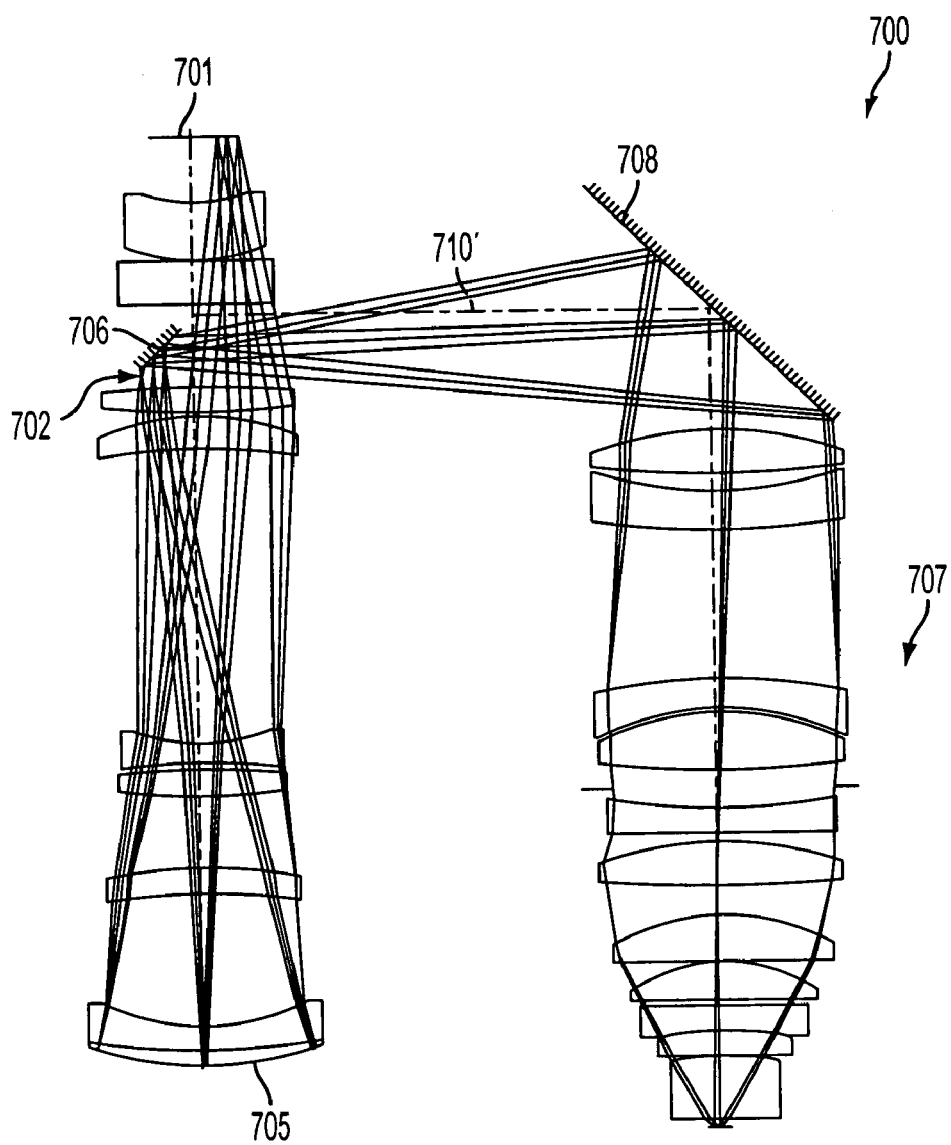
FIG. 8 shows an embodiment of a catadioptric dry objective with geometric beam splitting and h-folding according to an embodiment of the invention.

By using FIG. 8, it will be explained, by way of example, that the invention can also be used with advantage in other catadioptric projection objectives having a single concave mirror and a single real intermediate image. The optical structure of the projection objective 700 with respect to sequence and layout of the lenses along the optical axis can be taken from U.S. Pat. No. 6,195,213 B1, which in FIG. 2 and table 1 shows a corresponding optical system with conventional h-folding. The disclosure content in this respect is made the content of this description by reference.

The projection objective 700 is built up in such a way that the radiation coming from the object plane 701 firstly strikes the concave mirror 705, from which it is reflected in the direction of the first folding mirror 706. The latter is arranged with a reflecting surface facing the optical axis 710 such that the radiation is reflected in the direction of a second folding mirror 708, which follows without any interposed lenses and deflects the radiation in the direction of the lenses of the refractive objective part 707. Since the first folding mirror 706 is arranged on the side of the optical axis 710 that is located opposite the refractive objective part 707 and the radiation coming from the object field on its way to the concave mirror initially passes the first deflection mirror 706 on its side facing the second objective part, the second beam section leading from the concave mirror via the folding mirror 706 to the image plane crosses the first beam section leading from the object plane to the concave mirror in a cross-over region, which is located between the first and second folding mirror in the vicinity of the first folding mirror 706. The intermediate image 702 is produced immediately in front of the first folding mirror.

The crossed beam guidance in the case of h-folding has a number of advantages as compared with the conventional arrangement of the folding mirrors. From the point of view of mounting technology and mechanics, it is beneficial that the first folding mirror 706 is located on the side of the optical axis 710 facing away from the second objective part 707. As a result, a stable fixing is possible with the aid of a compact fixing construction fitted to the rear side of the mirror on a mounting element which can be fitted stably with the lens mounts of the optical components located in front of and behind the first folding mirror. From a mechanical-optical point of view, care must be taken that, in the crossed beam guidance according to the invention, the first folding mirror in relation to the part of the optical axis running between the object plane and concave mirror is on the side facing away from the second objective part 707, which corresponds to an arrangement of the first folding mirror on the (lower) side, facing away from the object plane, of the horizontal section 710' of the optical axis between the first folding mirror and the second folding mirror. In the case of the beam guidance according to the invention, this horizontal part 710' of the optical axis can be brought considerably closer to the reticle plane than in the case of conventional h-folding, in which the horizontal part of the optical axis is located geometrically between the first folding mirror and the concave mirror, that is to say on the side of the first folding mirror facing away from the reticle. By displacing the horizontal part of the optical axis in the direction of the object plane, a reduction in the geometric optical conductance (etendue) can be achieved, since the critical (inner) edge of the folding mirror can be brought closer to the reticle plane.

By using the following figures, exemplary embodiments of catadioptric projection objectives according to the invention having more than one real intermediate image and more than one concave mirror will be explained. These are distinguished, inter alia, by the fact that, with a beneficial design, they permit good correction of image errors, in particular it being possible to achieve effective correction of the Petzval sum (that is to say the image field curvature) and chromatic aberrations under conditions which are beneficial to fabrication.

Figure 9A:
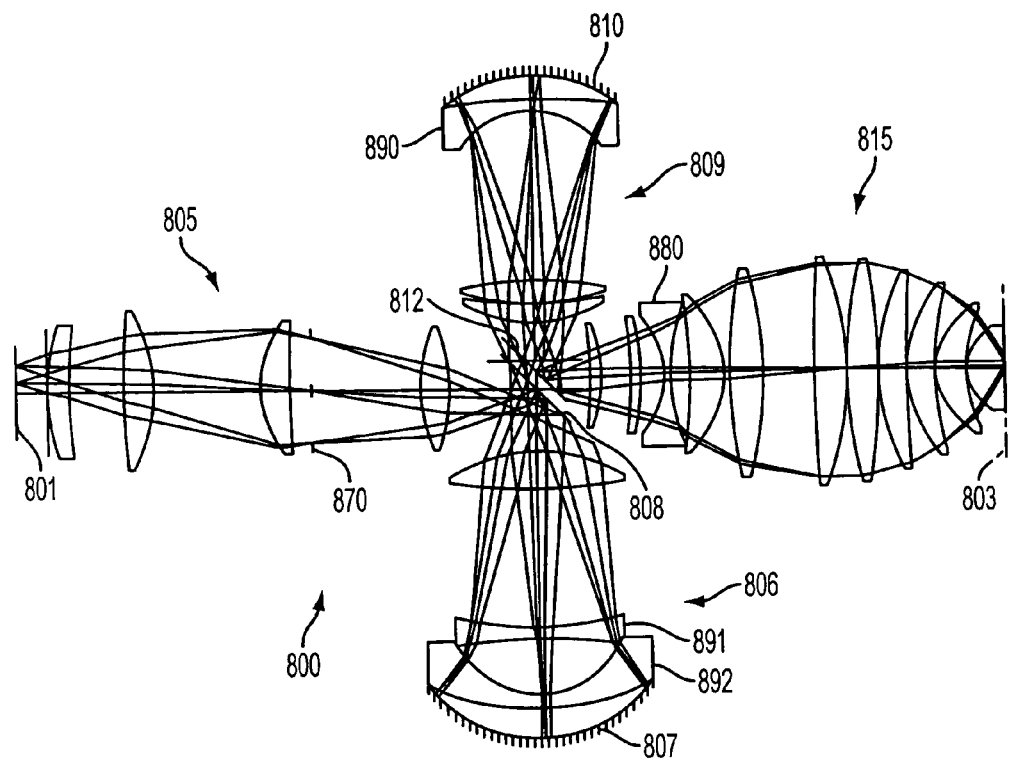
FIG. 9a shows an embodiment of an immersion projection objective according to the invention having two intermediate images with a cross shape and asymmetrical structure of two catadioptric objective parts.
Figure 9B:
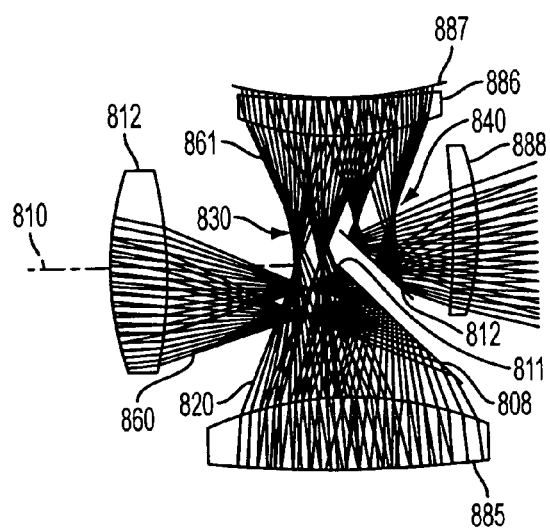
FIG. 9b shows a detailed view of the folding device in FIG. 8.

FIG. 9a shows an embodiment of a projection objective according to the invention having two catadioptric objective parts, two refractive objective parts and precisely three real intermediate images. FIG. 9b shows a detailed view of the region of the beam deflection device (folding device). The crossed beam path can be seen particularly well in this illustration.

The immersion projection objective 800 has between its object plane 801 and the image plane 803, in this order, a first dioptric objective part 805, a first catadioptric objective part 806 having a first concave mirror 807 and an associated folding mirror 808, a second catadioptric objective part 809 having a second concave mirror 810 and an associated folding mirror 812, and also a second refractive objective part 815. From the reticle (object plane 801, shown on the left in the figure), the light passes through the first refractive objective part 805, which forms the first intermediate image 820. After that, the light strikes the first folding mirror 808 in the light passage direction, which is immediately behind the first intermediate image, in the vicinity of the latter, and deflects the light in the direction of the first concave mirror 807. The associated catadioptric objective part 806, which points downward in the drawing, can be aligned substantially horizontally in operation. Such objective parts are also designated a horizontal arm (HOA) here. The catadioptric objective part 806 projects the light of the first intermediate image onto a second intermediate image 830, which is located in the vicinity of the first folding mirror 808. More precisely, the second intermediate image is located in the vicinity of an inner mirror edge 811, facing the optical axis 810, of the first folding mirror 808, in the geometric space between this edge and the last lens 812 of the first refractive objective part 805. From the second intermediate image 830, the light passes through the second catadioptric objective part 809, which forms a third intermediate image 840 on the return path from the concave mirror 810, said image being located immediately in front of the second folding mirror 812. By means of the second refractive objective part 815, the third intermediate image 840 is projected directly, that is to say without a further intermediate image, onto the wafer arranged in the image plane 803.

In FIG. 9 it is possible to see particularly well that the beam path 860 leading from the object plane 801 of the first concave mirror 807, and the second beam path 861 leading from the first concave mirror 807 to the following objective part and finally to the image plane, cross in the vicinity of the first folding mirror 808, approximately in the region of the first intermediate image. The further course of the beam after the second intermediate image is then free of any crossing.

This cross-like structure with two coaxial concave mirrors has precisely three real intermediate images. There therefore exist four possible positions for aperture stops bounding beams (real pupil positions), mainly in the first refractive objective part 805, in the vicinity of the concave mirrors 807 and 810, and in the second refractive objective part 815. In this specific exemplary embodiment, the aperture stop 870 is located in the first refractive objective part.

The folding mirrors 808, 812 are in each case located in the geometric (physical) vicinity of the intermediate images, which minimizes the optical conductance, so that the object field can be arranged minimally extra-axially. The intermediate images, that is to say the entire region between the paraxial intermediate image and the marginal ray intermediate image, do not lie on the mirror surfaces, however, so that possible errors in the mirror surfaces are not projected sharply into the image plane. In this case, the first and the third intermediate images are in each case located both optically and geometrically in the immediate vicinity of the most closely situated folding mirror, while the second intermediate image 830, although it is located geometrically in the immediate vicinity of the inner mirror edge 811, is located optically approximately centrally between the concave mirrors 807 and 810.

The reflecting surfaces of the folding mirrors in this embodiment are in each case inclined at 45° with respect to the optical axis, so that the folding angles are exactly 90°. This rectangular folding is beneficial to the performance of the reflective layers of the folding mirrors.

The reticle plane 801 (plane of the object field) is not affected by the mounting technology. In particular, there is a large spacing from the concave mirrors, on account of the first relay system 805. No cut-off lenses are necessary, so that all the lenses can be formed as round lenses.

The specification of the design is summarized in tables 5 and 6 in tabular form and conventional notation. The system, designed as a catadioptric immersion objective, with a full field of 26·5.5 mm² and extremely pure water as immersion liquid, reaches an image-side numerical aperture NA=1.3. The projection objective per se is not aperture-limited, since there is beneficial folding geometry with an intermediate image in the vicinity of a folding mirror. Higher apertures, for example NA=1.35 or NA=1.4 or NA=1.5 or NA=1.7, are available if more highly refractive immersion media are used. The diagonal ratio between the length of a diagonal of a minimum circle centered in relation to the optical axis and enclosing the object field and the length of a diagonal of the object field (cf. FIG. 3) is about 1.17. The wavefront aberrations are 7.5 m$\lambda$. In embodiments for 193 nm, all the lenses consist of silicon dioxide. The optically free lens diameters are considerably less than 300 mm. The mass of the raw material (raw compound) necessary for lens production is lower as compared with conventional refractive systems or conventional catadioptric systems mentioned at the beginning having h-folding or l-folding, which represents a considerable improvement.

In the following text, further special features will be indicated which, in each case individually or in combination with other features, can be beneficial in this and in other embodiments. The design contains four field lenses or field lens systems 812, 885, 886/887, 888 with a positive refractive power, which are in each case arranged in the immediate vicinity of the folding mirrors and the intermediate images. In at least one of the catadioptric horizontal arms, there should be a negative lens, in order to ensure the chromatic correction. Preferably, at least one negative lens 890, 891, 892 is provided in each catadioptric objective part, preferably in the immediate vicinity of the concave mirror. Beneficial variants include at least three lenses which are passed through twice. In the exemplary embodiment shown, there are six lenses which are passed through twice, namely the field lenses 885, 886, 887 and the negative lenses 890, 891, 892 in front of the concave mirrors for the chromatic correction of the longitudinal color error.

Beneficial variants include little negative refractive power in the refractive objective parts, which means that the lens diameters of these parts can be kept small overall. In the exemplary embodiment, only in the second refractive objective part 815 is a biconcave negative lens 880 provided in the divergent beam path on the input side of the objective part, at the exit side of which high angles of incidence beneficial to the correction occur.

The design exhibits high coma in the intermediate images, in particular in the third intermediate image 840. This helps to correct the sine condition in the image space without surfaces with excessively high angles of incidence in the second refractive objective part 815.

Figure 10:
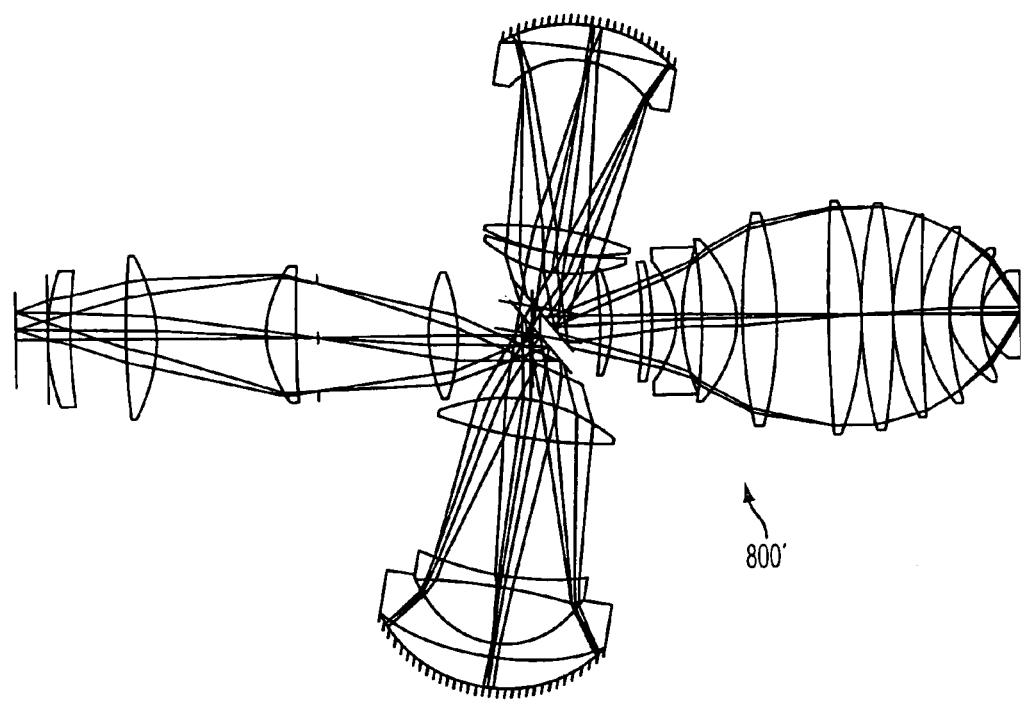
FIG. 10 shows a variant of the system shown in FIG. 9a with oblique horizontal arms.

Numerous variants are possible. In this regard, FIG. 10 shows, by way of example, an optically identical variant of a projection objective 800' having catadioptric subsystems inclined obliquely with respect to the optical axis for more beneficial reflecting layers. In the embodiment shown, the horizontal arms continue to be coaxial but are inclined by 20° with respect to a vertical alignment. The angles of incidence at the folding mirrors can thus be reduced.

Figure 11:
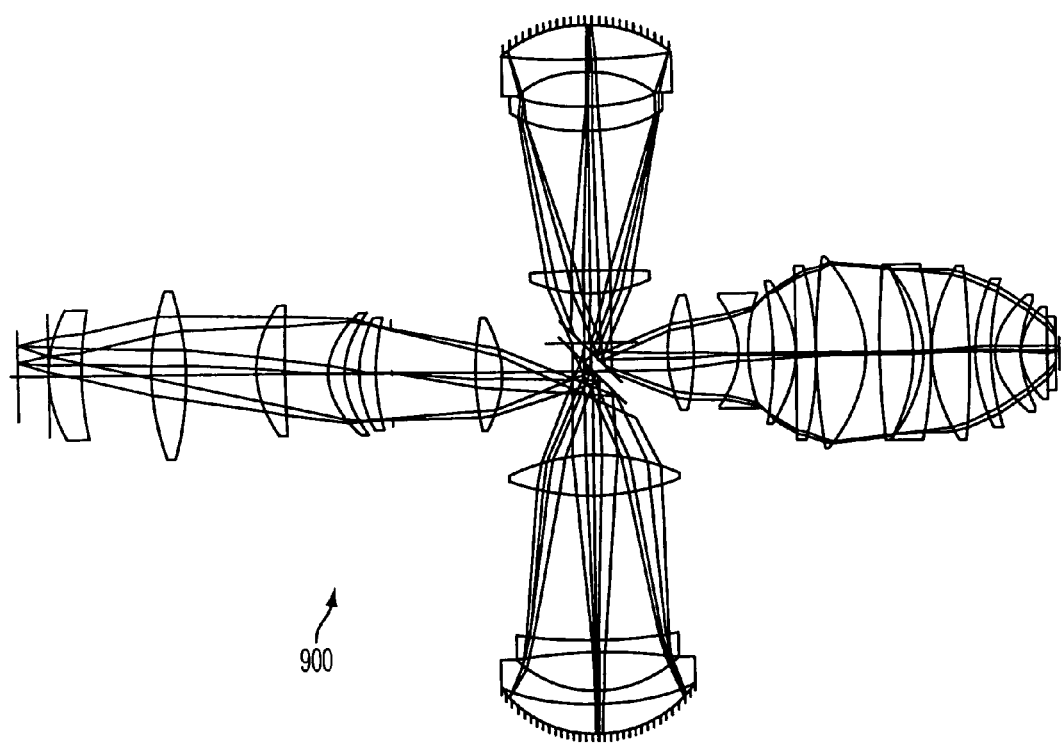
FIG. 11 shows an embodiment of a dry system according to the invention having three intermediate images and a cross shape.

It is also possible to design projection objectives according to the invention as a dry objective. FIG. 11 shows, by way of example, a projection objective 900 having an image-side numerical aperture NA=0.95 and a finite working distance at the wafer. In dry systems, the space between the objective exit face and the wafer is filled with a gas during operation. System data for the cross-like dry system in FIG. 11 is specified in tables 7 and 8. In this system, at individual surfaces of the second refractive objective part, in particular at the exit face of the input-side biconcave negative lens and at the exit face of the object-side concave negative meniscus lens, very high angles of incidence, which contribute effectively to the correction, occur in the immediate vicinity of the pupil face situated most closely to the image.

Figure 12:
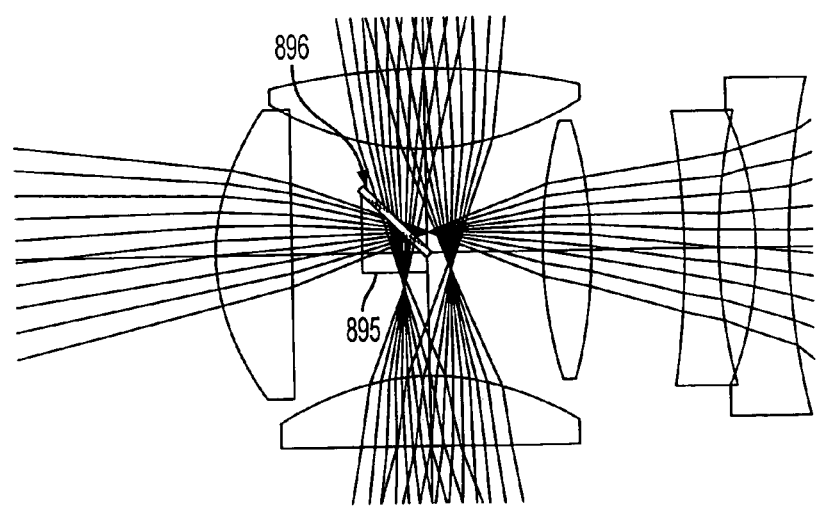
FIG. 12 shows a folding device with prism.

The embodiments shown in FIGS. 9 to 11 are designed such that the two flat folding mirrors are positioned at a short distance from each other, back to back, that is to say with reflecting surfaces facing away from each other. Under certain circumstances, this can be achieved by means of a single, double-silvered element which can have the form of a plane-parallel plate. In principle, it is also possible for the beam deflection to be carried out with a solid material prism, as shown in FIG. 12. In this case, the light coming from the object plane firstly enters the folding prism 895 and the first folding reflection takes place at the hypotenuse face 896 of the prism. After passing through the first catadioptric objective part and the second catadioptric objective part, the second folding reflection takes place at the same hypotenuse face, but on its rear side. In the embodiment shown in FIG. 12, a first beam path leads from the object plane (not shown) via the first folding mirror (inner side of the hypotenuse face) and the first concave mirror (not shown, arranged at the bottom in the figure) to the second concave mirror (not shown, located at the top in the figure), and the second beam section, after reflection at the second concave mirror, leads via the second folding mirror (outer side of the hypotenuse face) in the direction of the image plane. In this case, the crossing of the beam paths takes place immediately after the reflection at the second folding mirror and the formation of the third intermediate image, in the immediate vicinity of the reflecting surface of the second folding mirror, between the latter and the first lens of the following, second refractive objective part.

For the case in which calcium fluoride is selected for the deflection prism, for reasons of laser resistance, care must be taken that, with its refractive index of n≈1.50 at 193 nm and the numerical aperture of about NA=0.3 present at the intermediate image, total reflection over the entire beam cross section is not to be expected. It is therefore beneficial to apply a powerful reflective layer, reflecting on both sides, to the hypotenuse face. However, it is also possible to enlarge the folding angle in the prism in such a way that total reflection occurs at the hypotenuse face for all incident rays. It is then possible to dispense with a reflective coating.

Within the scope of this cross-like design, numerous variants are possible. For example, it is possible to provide different projection scales, for example reduction scales of 4:1, 5:1 or 6:1. Higher projection scales (for example 5:1 or 6:1) can be more beneficial, since they reduce the object-side aperture and can thus relax the requirements on the folding geometry.

The first refractive subsystem, serving as a relay system, which forms the first intermediate image, has a projection scale β close to 1 in the exemplary embodiments. However, this is not imperative. It is equally not very necessary for the catadioptric objective parts to have projection scales in the region of 1. Here, a magnifying projection scale of the first objective part can be beneficial to relaxing the requirements on the folding geometry.

In the above examples of catadioptric systems having three intermediate images and two catadioptric subsystems, the refractive front system (first subsystem, relay system) is constructed asymmetrically. The distance between the two planar folding mirrors should be small, in order that the distance of the extra-axial object field from the optical axis remains as small as possible with vignetting-free projection, and thus reduce the requirements on the optical design for achieving a small etendue or a small superfield. In addition, the object-image shift (OIS), that is to say the lateral offset between the object-side optical axis and image-side optical axis, then remains small.

Figure 13:
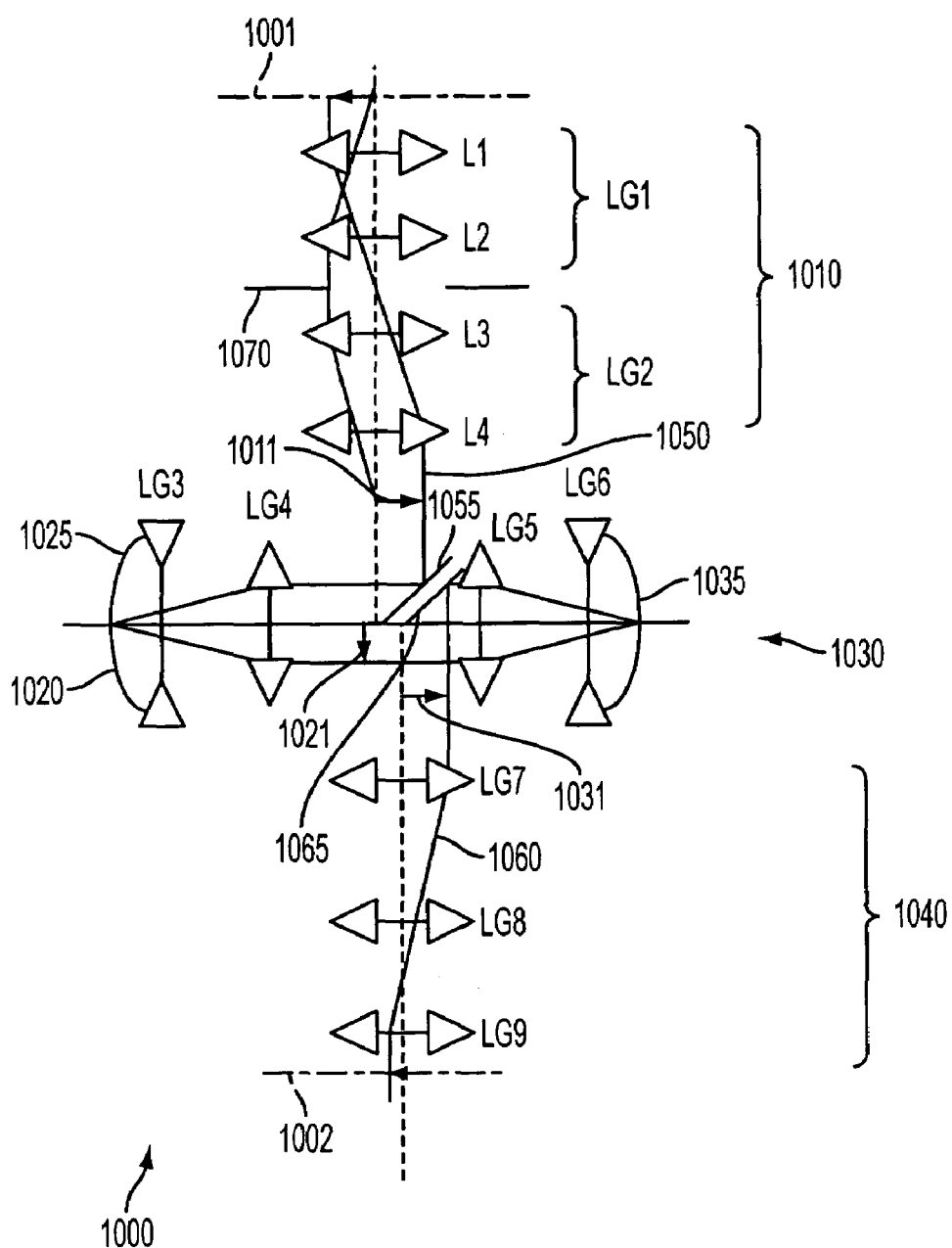
FIG. 13 shows another embodiment of a projection objective built up in a cross shape with a largely symmetrical structure.

By using FIG. 13, a variant of a cross-like catadioptric system 1000 having two concave mirrors and three intermediate images will be shown, being distinguished by a largely symmetrical structure. It has, between its object plane 1001 and its image plane 1002, a first refractive objective part 1010, which forms a first intermediate image 1011, a first catadioptric objective part 1020, which forms a second intermediate image 1021 from the first intermediate image, a further catadioptric objective part 1030, which forms a third intermediate image 1031 from the second intermediate image, and a fourth, refractive object part 1040, which projects the third intermediate image into the image plane 1002. All the objective parts have a positive refractive power. Lenses or lens groups with a positive refractive power are represented by double arrows with points aimed outward, lenses or lens groups with a negative refractive power, on the other hand, are represented by double arrows with points aimed inward.

A first beam section 1050 runs from the object plane 1001 via the first folding mirror 1055 and the associated concave mirror 1025 following in the light path to the concave mirror 1035 of the second catadioptric objective part 1030. A second beam section 1060 runs from this concave mirror 1035 via the second folding mirror 1065 to the image plane. On the way from the second folding mirror to the image plane, the second beam section crosses the first beam section in the region in front of the reflecting surface of the second folding mirror.

The first objective part 1010 comprises a first lens group LG1 with a positive refractive power and a second lens group LG2 with a positive refractive power. Between these two lens groups, the main beam intersects the optical axis at the point of a preferred aperture stop plane (system aperture stop) 1070.

The first lens group LG1 preferably comprises at least two positive lenses, namely at least one lens L1 close to the field and at least one lens L2 close to the aperture. This applies in a corresponding way to the lens group LG2, which preferably has at least one lens L4 close to the field and at least one lens L3 close to the aperture.

Meeting the following conditions, individually or in combination, can be beneficial to simplifying the fabrication of the system:

LG1=LG2; L1=L2=L3=L4; L1=L4; L2=L3.

In these equations, the equality of two lenses is to be understood to mean equality of their radii. The lenses can therefore have unequal thicknesses. The equality of radii is not to be understood to be mathematically exact but, from a fabrication point of view, that the lens faces should be capable of production with the same tool. For the equality of lens groups, appropriate boundary conditions apply. Such systems offer advantages in fabrication, since the production and testing of the lenses are simplified.

The arrangement of the lenses can be symmetrical or asymmetrical in relation to planes perpendicular to the optical axis. Here, a symmetrical structure with reference to the aperture stop plane 1070 is beneficial. In advantageous embodiments, the aperture stop is fitted in this aperture stop plane for the purpose of variable limiting of the beam diameter. This is beneficial since, as a result, no asymmetrical image errors are introduced into the first intermediate image 1011.

The projection scale β of the first objective part 1010 can be about β=1. Although the first subsystem 1010 is constructed largely symmetrically, it is operated asymmetrically, that is to say with β≠1. The advantage of this quasisymmetrical arrangement is the introduction of a value which is advantageous for the further correction of the chromatic magnification difference (transverse color error), and other asymmetrical image errors, primarily coma.

The objective can have one or more aspherical faces. The lens L1 arranged close to the field preferably bears at least one aspherical face in order to correct the telecentering in the object space. Alternatively or additionally, one of the lenses L3 and/or L4 can bear at least one aspherical face in order to correct the spherical aberration in the first intermediate image. This relieves the folding geometry stress and permits a small etendue (optical conductance).

The first objective part 1010 is preferably constructed with "a low Petzval", that is to say with lenses with a reduced Petzval sum. A "low Petzval" structure can be produced if lenses with a small Petzval sum are employed, in particular suitable meniscuses. The telecentering, spherical aberration and astigmatism can be corrected by means of aspheres on the lenses L1 and L2 or L3 and L4.

In general, in these and in the other embodiments, the optical distance between a reflecting surface of a folding mirror and the most closely situated intermediate image should lie between a finite minimum distance and a maximum distance. The maximum distance can, for example, be 1/10 or 1/15 or 1/20 of the system length (overall length, distance between object plane and image plane). The minimum distance should be small in comparison with this.

It is beneficial if the first objective part 1010 is over-corrected spherically if the first folding mirror 1055 is situated behind the paraxial intermediate image 1011, and is under-corrected spherically if the paraxial intermediate image is situated behind the folding mirror. This ensures that the intermediate image does not lie on the reflecting surface.

The Petzval sum is preferably set such that the focus of the outermost field point and of the innermost field point are located virtually at the same distance from the first folding mirror. The intermediate image can then be moved close to the reflecting surface, since the curved image field curves away from the reflecting surface. This relaxes the requirements on the folding geometry and permits a small etendue.

The catadioptric objective parts 1020, 1030 are preferably constructed doubly telecentrically. This permits the correction of the astigmatism in the second and third intermediate image.

It is possible that the first objective part 1010 has no negative lenses. In some embodiments, provision is made to correct the Petzval sum in the refractive first objective part 1010 as well or to reduce it sharply. Negative lenses close to the object or close to the image can be used for this purpose.

The catadioptric objective parts 1020, 1030 are preferably constructed axially symmetrically, so that all the lenses are used with a double passage. It is beneficial if they comprise a positive lens group LG4 or LG5 in the vicinity of the corresponding intermediate image, and a negative lens group LG3 or LG6 in the vicinity of the concave mirror. The positive lens groups LG4, LG5 preferably have one or two positive lenses, the negative lens groups LG6, LG3 have a maximum of three negative lenses. In some embodiments, it is possible to dispense with negative lenses in one of the catadioptric objective parts.

A symmetrical structure of the catadioptric parts can be beneficial. It is preferable if, according to the above explanations, the following conditions are met, alternatively or in combination: LG4=LG5; LG3=LG6; and M1=M2, where M1 and M2 are the concave mirrors 1020, 1035. The equality of the optical components is to be understood in the sense of the above definition of equality of radii. In the case of a symmetrical structure, the aberration load (Petzval and longitudinal color error CHL) is distributed substantially uniformly to the two catadioptric objective parts. This structure can be very advantageous, since the refractive powers and, as a result, the aberration contributions can be minimized.

It can be beneficial to operate the catadioptric objective parts 1020, 1030 quasi-symmetrically, that is to say with a projection scale differing slightly from $\beta=1$. This permits simple correction of the transverse color error (CHV) for the overall system.

In another preferred arrangement, the positive lens groups LG4, LG5 each comprise two positive lenses, which can in particular be identical. This relaxes the requirements on the aberration contributions of these lens groups.

It can be beneficial if the catadioptric objective parts 1020, 1030 are constructed such that the Petzval sum of the refractive lens elements of the lens groups LG3 and LG4 in the first catadioptric objective part 1020, and LG5 and LG6 in the second catadioptric objective part 1030 compensate one another, largely or completely. Then, the Petzval contribution of the concave mirrors 1025, 1035 primarily remains for the compensation of the Petzval curvature of the objective parts.

In the catadioptric parts, one or more aspherical faces can be provided. This permits or assists a correction in the second and third intermediate image, and thus permits relaxation of the requirements on the folding, and also a reduction in the optical conductance.

The refractive objective part 1040 is preferably constructed from three lens groups, namely a first lens group LG7 close to the field and a second and third lens group LG8 and LG9, between which the main beam cuts the optical axis, so that a preferred aperture stop plane is produced here. Lens group LG8 in front of the system aperture stop preferably has at least one face curved toward the image plane with high beam angles, for example an image-side lens face of a negative meniscus lens or a negative biconcave lens. This contributes substantially to the correction of the sine condition. No lens group should be arranged between the aperture stop position and the image plane, that is to say in the lens group LG9. It is beneficial if the last two or more lens elements consist of calcium fluoride with various crystal orientations, by which means compaction problems can be avoided and, at the same time, influences of the intrinsic birefringence can at least partly be compensated for.

The two plane-parallel folding mirrors 1055, 1065 can be provided on a single plane-parallel plate reflective on both sides. This should consist of a highly transparent material. This permits simple testing of the parallelism before coating with reflective layers. Preferred material for the substrate is silicon dioxide. As a result of a small distance between the folding mirrors, a reduction in the objective etendue (and in the object image shift) is possible.

Within the scope of the invention, systems having more than three intermediate images are also possible. As a result, further degrees of design freedom for optimizing the space required and the optical correction can be created. The projection objective 1100 in FIG. 14 has between its object plane 1101 and the image plane 1102 a first refractive subsystem 1110 for forming a first real intermediate image 1111, a first catadioptric objective part 1120 for forming a second real intermediate image 1121 from the first intermediate image, a second refractive subsystem 1130 for forming a third intermediate image 1131 from the second intermediate image, a further catadioptric objective part 1140 for forming a fourth intermediate image 1141 from the third intermediate image, and a third refractive objective part 1150 which projects the fourth intermediate image into the image plane 1102. The first catadioptric objective part 1120 comprises a first folding mirror 1122 for deflecting the radiation coming from the object in the direction of the concave mirror 1125, and the second catadioptric objective part 1140 has a folding mirror 1142 which is assigned to the concave mirror 1145 and deflects the radiation coming from the concave mirror 1145 in the direction of the image plane.

In the region of the first catadioptric objective part, a first beam section 1160 leads from the object plane via the first folding mirror 1122 to the concave mirror 1125, and a second beam section 1170 leads from the latter to the following objective parts. The two beam sections cross one another in the vicinity of the object-side mirror edge, facing the first objective part 1110, of the folding mirror 1122. A symmetrical situation results in the second catadioptric objective part 1140. The radiation passing from the object plane to its concave mirror 1145 forms a first beam section 1170, the radiation reflected from the mirror 1145 and deflected by the plane mirror 1142 in the direction of the image plane forms a second beam section 1180, which crosses the first beam section in a cross-over region between the folding mirror 1142 and refractive subsystem 1150. The overall projection objective can have substantially a point-symmetrical structure, in which the point of symmetry lies within the central relay system 1130.

The entry-side and exit-side refractive systems 1110 and 1150 in each case have a projection scale β≈1, and this is also true of the catadioptric objective parts 1120 and 1140. The refractive relay system 1130, which transfers the radiation from the first catadioptric subsystem 1120 to the second catadioptric subsystem 1140 with a projection, has a projection scale in the region of 1:3 to 1:6. This reduction also corresponds to the overall reduction of the projection objective. In the basic structure refractive-catadioptric-refractive-catadioptric-refractive, the axial orientation can be set as required by means of suitable alignment of the folding mirrors.

The aberration compensation proceeds in a similar way to that in the preceding examples. The series of continuous lines corresponds to the main ray of the outer field point.

Figure 14:
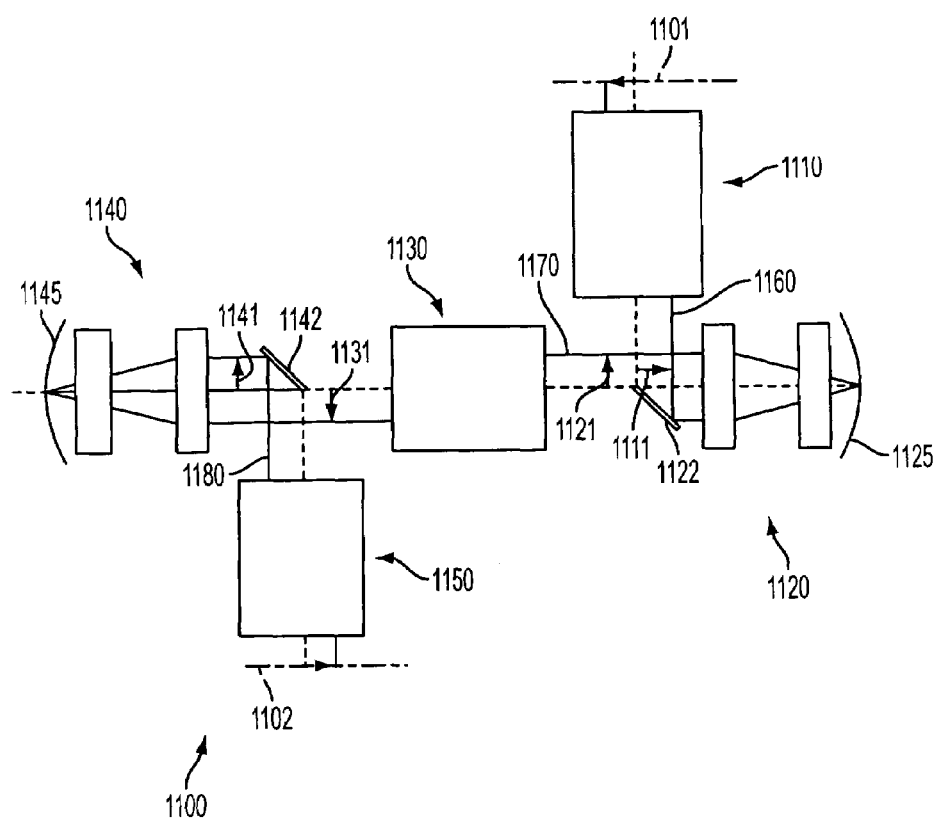
FIG. 14 shows a further embodiment of a projection objective according to the invention with a relay system arranged between two catadioptric objective parts.

In the system in FIG. 14, the optical axes of the catadioptric subsystems 1120 and 1140 run coaxially, so that an inclination of one of the axes defines the inclination of the other axes. If, for example, one axis is inclined in order to create space, the other axis may also be inclined such that space is restricted. In the following text, exemplary embodiments of how such problems can be avoided will be shown. They can be used as self-contained projection objectives or as subsystems within a more complex catadioptric structure.

Figure 15:
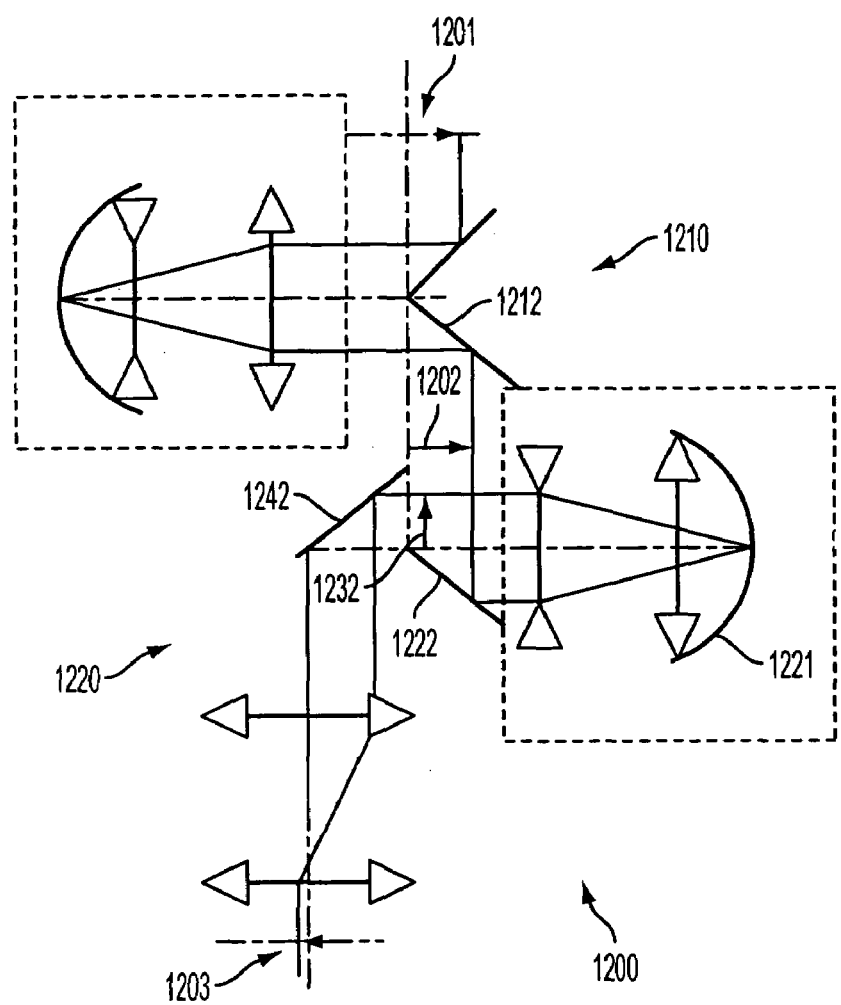
FIG. 15 shows an embodiment of a projection objective according to the invention with decoupled optical axes of the catadioptric objective parts.

From the point of view of the basic structure, the projection objective 1200 in FIG. 15 represents a combination of a catadioptric projection objective 1210 with 1-folding and two folding mirrors fitted to a mirror prism (cf. FIG. 5) and a following catadioptric subsystem 1220 with modified 1-folding and crossed beam path (for example according to FIG. 4). The first catadioptric subsystem 1210 forms a real intermediate image 1202 from the extra-axial field, which is arranged in its object plane 1201. This intermediate image is projected into the image plane 1203 of the system by the second catadioptric subsystem 1220.

Figure 16:
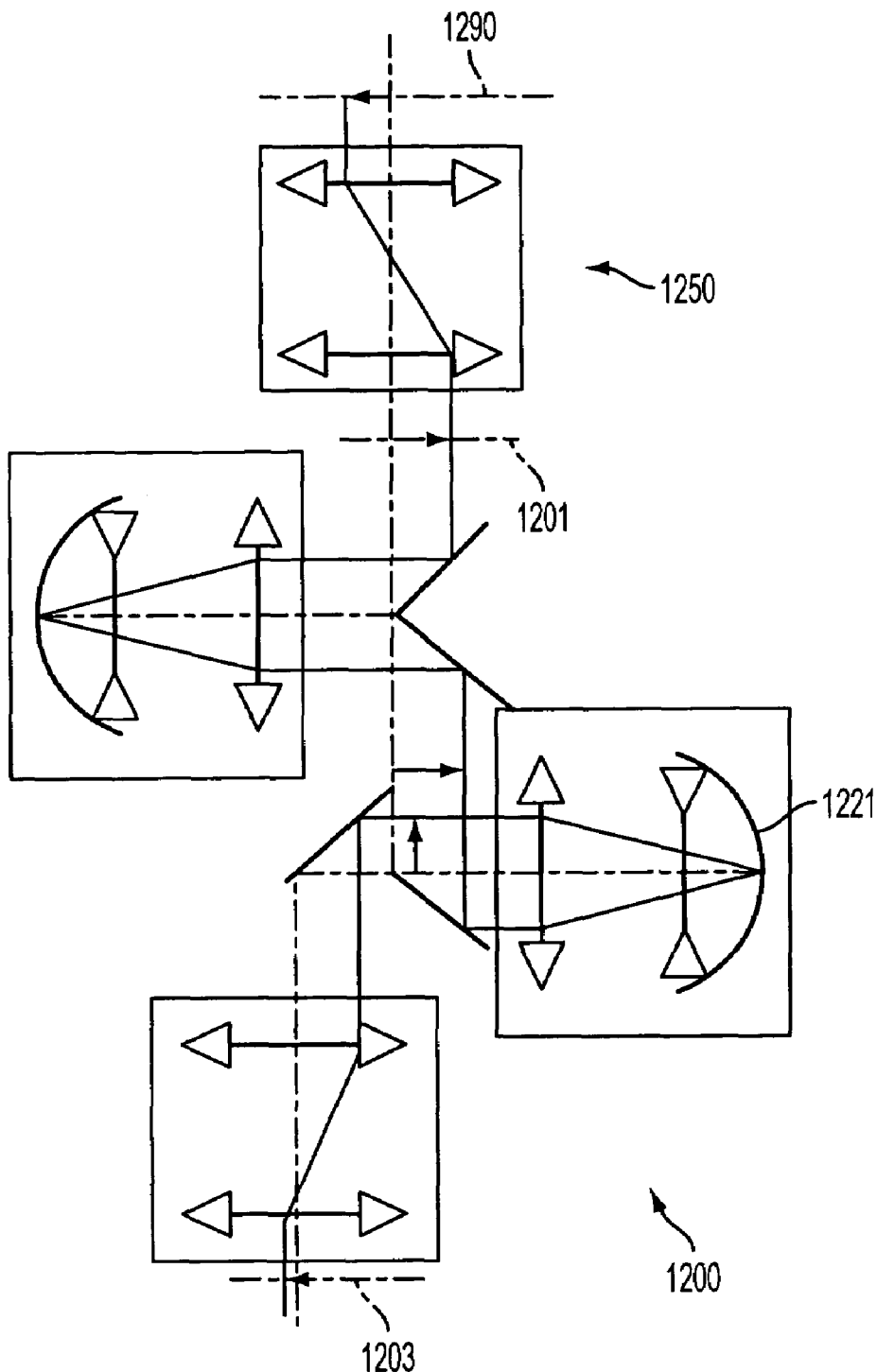
FIG. 16 shows a further embodiment of a projection objective according to the invention with decoupled optical axes of the catadioptric objective parts.

The object plane 1201 of the system shown can be the object plane of the entire projection objective or an intermediate image plane, in which there is situated an intermediate image which is formed by a subsystem connected upstream but not shown in FIG. 15. FIG. 16 shows, by way of example, such a structure, which is provided in a refractive subsystem 1250, serves as a relay system and forms a real intermediate image of the object plane 1290 in the plane 1201. This is used as the object of the following catadioptric system according to FIG. 15, which comprises two axially offset concave mirrors.

In both the embodiments, a first beam section leads via multiple folding to the concave mirror 1221 of the second catadioptric objective part 1220, while a second beam section runs from this mirror via the second folding mirror 1242 to the image plane 1203. In the geometric space between the exit-side folding mirror 1212 of the first catadioptric objective part and the first folding mirror 1222 of the second catadioptric objective part 1220, the first beam path and the second beam path cross behind the intermediate image 1202.

The projection system shown in FIG. 15, which can be a self-contained projection objective or a subsystem within a larger projection objective (cf. FIG. 16), has two real intermediate images 1202, 1232. The optical axes of the catadioptric objective parts 1210, 1220 are decoupled from each other, that is to say are not coaxial with each other but offset laterally parallel to each other. The catadioptric subsystems are in each case constructed axially symmetrically. Each includes a positive lens group close to the object and a negative lens group close to the concave mirror. Therefore, positive refractive power is arranged in the vicinity of the intermediate images and of the folding mirrors here too, while negative refractive power is concentrated in the vicinity of the concave mirrors.

As shown in FIG. 16, the subsystem illustrated in FIG. 15 can be used to project the intermediate image of the object field formed by a relay system 1250 into the image plane of the projection objective. The overall system then has three intermediate images.

Another variant provides that, in this system, the optical axes of the mirror groups can both be inclined in the direction of the wafer plane. This increases the space between the concave mirror of the first catadioptric objective part and the reticle plane or intermediate image plane 1201.

All the embodiments illustrated by way of example can be incorporated in the projection exposure machine shown in FIG. 1 instead of the projection objective 5. In the case of wafer scanners, care must be taken that the drive for the movements of the device 40 for holding and manipulating a mask (reticle stage) and the device 50 for holding and manipulating the wafer (wafer stage) must be matched to the type of catadioptric projection objective. Depending on the number of folding mirrors, concave mirrors and intermediate images, the drive must be configured such that either a scanning movement of reticle and wafer stage in the same direction or a movement of reticle and wafer stage in opposite directions takes place during scanning. If the sum S of the number Z of intermediate images, the number F of folding mirrors and the number K of concave mirrors is an uneven number, then a scanning movement in the same direction must be provided; if the sum S is an even number, then a scanning movement in opposite directions must be produced. Therefore, in the embodiments explained by using FIGS. 9, 10, 11, 12, 13 and 16, a scanning movement in the same direction must be provided, while in the embodiments according to FIGS. 2, 6, 7, 8, 14 and 15, reticle and wafer must be moved in opposite directions in relation to each other along the y axis.

TABLE 1

| Face | Radii | Thicknesses | Material | Index | ½ diameter |
|---|---|---|---|---|---|
| 1 | 0.000000 | 0.000000 | AIR | | 79.675 |
| 2 | 0.000000 | 10.000000 | SIO2HL | 1.56018811 | 79.675 |
| 3 | 0.000000 | 1.000000 | AIR | | 81.476 |
| 4 | 319.475286 | 20.000234 | SIO2HL | 1.56018811 | 85.084 |
| 5 | 995.269474 | 68.424969 | AIR | | 85.919 |
| 6 | 0.000000 | 169.872505 | AIR | | 95.577 |
| 7 | −970.753457 | 44.999585 | SIO2HL | 1.56018811 | 119.609 |
| 8 | −327.540786 | 217.911147 | AIR | | 123.649 |
| 9 | −231.387741 | 17.500000 | SIO2HL | 1.56018811 | 125.416 |
| 10 | −1065.062890 | 48.294619 | AIR | | 135.575 |
| 11 | −196.821494 | 17.500000 | SIO2HL | 1.56018811 | 136.404 |
| 12 | −525.772724 | 32.979078 | AIR | | 160.520 |
| 13 | 0.000000 | 0.000000 | REFL | | 204.292 |
| 14 | 264.796887 | 32.979078 | REFL | | 162.687 |
| 15 | 525.772724 | 17.500000 | SIO2HL | 1.56018811 | 160.034 |
| 16 | 196.821494 | 48.294619 | AIR | | 132.915 |
| 17 | 1065.062890 | 17.500000 | SIO2HL | 1.56018811 | 130.452 |
| 18 | 231.387741 | 217.911147 | AIR | | 117.791 |
| 19 | 327.540786 | 44.999585 | SIO2HL | 1.56018811 | 101.599 |
| 20 | 970.753457 | 181.477269 | AIR | | 96.159 |
| 21 | 0.000000 | 128.395393 | AIR | | 61.789 |
| 22 | 0.000000 | 24.998738 | AIR | | 110.784 |
| 23 | 312.774233 | 50.000130 | SIO2HL | 1.56018811 | 135.026 |
| 24 | −938.039680 | 2.332118 | AIR | | 135.592 |
| 25 | 715.324368 | 28.435222 | SIO2HL | 1.56018811 | 135.878 |
| 26 | −1554.047709 | 0.949762 | AIR | | 135.289 |
| 27 | 626.921957 | 28.002516 | SIO2HL | 1.56018811 | 132.433 |
| 28 | −1428.035483 | 37.991193 | AIR | | 130.956 |
| 29 | −309.156200 | 9.521188 | SIO2HL | 1.56018811 | 125.631 |
| 30 | −562.362375 | 181.567266 | AIR | | 125.277 |
| 31 | −173.995248 | 9.499422 | SIO2HL | 1.56018811 | 99.321 |
| 32 | 247.888809 | 29.437283 | AIR | | 109.165 |
| 33 | 8340.117725 | 32.129675 | SIO2HL | 1.56018811 | 111.460 |
| 34 | −312.940978 | 7.464540 | AIR | | 116.082 |
| 35 | 929.377252 | 44.625129 | SIO2HL | 1.56018811 | 132.361 |
| 36 | −333.512913 | 0.949477 | AIR | | 134.568 |
| 37 | 591.097249 | 44.418308 + C2 | SIO2HL | 1.56018811 | 140.004 |
| 38 | −1614.017804 | 24.278142 | AIR | | 140.003 |
| 39 | 0.000000 | −23.329538 | AIR | | 138.515 |
| 40 | 302.573027 | 9.498538 | SIO2HL | 1.56018811 | 139.988 |
| 41 | 225.452829 | 23.324104 | AIR | | 137.709 |
| 42 | 374.450165 | 43.305784 | SIO2HL | 1.56018811 | 138.658 |
| 43 | −1347.892608 | 0.947859 | AIR | | 139.026 |
| 44 | 302.595256 | 44.140336 | SIO2HL | 1.56018811 | 139.127 |
| 45 | −12394.382724 | 0.947473 | AIR | | 137.426 |
| 46 | 220.761542 | 40.029388 | SIO2HL | 1.56018811 | 125.456 |
| 47 | 809.070272 | 0.946947 | AIR | | 121.419 |
| 48 | 163.063737 | 40.300977 | SIO2HL | 1.56018811 | 103.421 |
| 49 | 762.111474 | 0.946425 | AIR | | 96.933 |
| 50 | 139.902742 | 77.435206 | SIO2HL | 1.56018811 | 75.207 |
| 51 | 0.000000 | 2.000000 | H2OV193 | 1.43667693 | 19.413 |
| 52 | 0.000000 | 0.000000 | AIR | | 17.000 |

TABLE 2

| | 5 | 8 = 19 | 10 = 17 | 12 = 14 | 27 |
|---|---|---|---|---|---|
| K | 0 | 0 | 0 | 0 | 0 |
| C1 | −1.188191E−08 | 3.591288E−09 | −4.791180E−09 | −8.429951E−10 | −5.683539E−09 |
| C2 | 1.967391E−13 | −3.350971E−14 | 6.912483E−14 | −5.232984E−15 | 6.541643E−15 |
| C3 | −7.746732E−18 | 1.502596E−18 | 2.275816E−19 | −3.132061E−19 | −2.750649E−19 |
| C4 | 4.382264E−23 | 2.954168E−23 | 1.312434E−22 | | 5.788139E−23 |
| C5 | 4.532193E−26 | −6.493001E−28 | −4.748900E−27 | 6.334947E−28 | −2.220373E−27 |
| C6 | −3.233502E−30 | 3.320789E−32 | 1.399914E−31 | −1.231728E−32 | 8.916186E−32 |

| | 33 | 35 | 37 | 47 |
|---|---|---|---|---|
| K | 0 | 0 | 0 | 0 |
| C1 | −8.560622E−09 | −2.328354E−08 | 1.335791E−09 | −1.418195E−08 |
| C2 | −1.349963E−12 | 2.144034E−12 | −8.056724E−13 | 1.409773E−12 |
| C3 | 1.587936E−16 | −1.398657E−16 | 4.148247E−17 | −6.196993E−17 |
| C4 | −8.008240E−21 | 5.252748E−21 | −9.137514E−22 | 1.830118E−21 |
| C5 | 2.874374E−25 | −1.188241E−25 | 1.616592E−26 | −3.946542E−26 |
| C6 | −6.218920E−30 | 1.696094E−30 | −2.274089E−31 | 2.728014E−31 |

TABLE 3

| Face | Radii | Thicknesses | Material | Index | ½ diameter |
|---|---|---|---|---|---|
| 1 | 0.000000 | 0.000000 | AIR | | 74.869 |
| 2 | 0.000000 | 10.000000 | SIO2 | 1.56097018 | 74.869 |
| 3 | 0.000000 | 0.500000 | AIR | | 76.658 |
| 4 | 3088.172820 | 10.000000 | SIO2 | 1.56097018 | 76.952 |
| 5 | 0.000000 | 60.000000 | AIR | | 78.641 |
| 6 | 0.000000 | 0.000000 | AIR | | 95.735 |
| 7 | 0.000000 | 134.465366 | AIR | | 95.735 |
| 8 | 302.601867 | 34.401664 | SIO2 | 1.56097018 | 144.675 |
| 9 | 705.234819 | 68.979243 | AIR | | 144.202 |
| 10 | 251.382127 | 33.175965 | SIO2 | 1.56097018 | 149.996 |
| 11 | 426.058169 | 289.332591 | AIR | | 147.417 |
| 12 | −260.112697 | 20.000000 | SIO2 | 1.56097018 | 121.372 |
| 13 | −572.625245 | 42.216988 | AIR | | 125.407 |
| 14 | −171.019518 | 20.000000 | SIO2 | 1.56097018 | 125.493 |
| 15 | −855.924382 | 37.063295 | AIR | | 149.787 |
| 16 | 0.000000 | 0.000000 | REFL | | 192.254 |
| 17 | 264.447259 | 37.063295 | REFL | | 151.718 |
| 18 | 855.924382 | 20.000000 | SIO2 | 1.56097018 | 150.217 |
| 19 | 171.019518 | 42.216988 | AIR | | 124.976 |
| 20 | 572.625245 | 20.000000 | SIO2 | 1.56097018 | 124.607 |
| 21 | 260.112697 | 289.332591 | AIR | | 118.964 |
| 22 | −426.058169 | 33.175965 | SIO2 | 1.56097018 | 123.141 |
| 23 | −251.382127 | 68.979243 | AIR | | 125.542 |
| 24 | −705.234819 | 34.401664 | SIO2 | 1.56097018 | 114.138 |
| 25 | −302.601867 | 148.236577 | AIR | | 113.753 |
| 26 | 0.000000 | 76.228794 | AIR | | 65.370 |
| 27 | 0.000000 | 0.000000 | AIR | | 87.565 |
| 28 | 0.000000 | 201.841415 | AIR | | 87.565 |
| 29 | 1761.166817 | 50.475596 | SIO2 | 1.56097018 | 148.012 |
| 30 | −358.244969 | 284.608494 | AIR | | 149.872 |
| 31 | 303.934833 | 35.000000 | SIO2 | 1.56097018 | 147.098 |
| 32 | 509.533530 | 7.170752 | AIR | | 143.625 |
| 33 | 370.904878 | 20.000366 | SIO2 | 1.56097018 | 142.151 |
| 34 | 211.313761 | 62.331548 | AIR | | 133.109 |
| 35 | 290.910582 | 56.153178 | SIO2 | 1.56097018 | 138.951 |
| 36 | −1106.757797 | 68.197851 | AIR | | 137.608 |
| 37 | −178.117460 | 59.999881 | SIO2 | 1.56097018 | 133.318 |
| 38 | −214.351289 | −12.849220 | AIR | | 148.117 |
| 39 | 0.000000 | 24.486144 | AIR | | 141.938 |
| 40 | 277.046273 | 63.368104 | SIO2 | 1.56097018 | 144.287 |
| 41 | −757.891281 | 0.999992 | AIR | | 142.301 |
| 42 | 127.447162 | 72.144248 | SIO2 | 1.56097018 | 110.531 |
| 43 | 316.261462 | 0.099994 | AIR | | 92.548 |
| 44 | 137.334842 | 47.277234 | SIO2 | 1.56097018 | 81.195 |
| 45 | 210.414165 | 0.999989 | AIR | | 54.341 |
| 46 | 110.455126 | 44.071322 | SIO2 | 1.56097018 | 48.586 |
| 47 | 0.000000 | 0.000000 | SIO2 | 1.56097018 | 16.000 |
| 48 | 0.000000 | 0.000000 | AIR | | 16.000 |

TABLE 5

| Face | Radii | Thicknesses | Material | Index | ½ diameter |
|---|---|---|---|---|---|
| 0 | 0.000000 | 40.000000 | | | 63.000 |
| 1 | 0.000000 | 0.000000 | | | 74.812 |
| 2 | 280.911554 | 29.101593 | SIO2 | 1.56029525 | 78.206 |
| 3 | 1315.382634 | 67.564457 | | | 79.868 |
| 4 | 1226.076021 | 36.889857 | SIO2 | 1.56029525 | 94.337 |
| 5 | −224.620142 | 132.650952 | | | 95.649 |
| 6 | 132.557450 | 37.873616 | SIO2 | 1.56029525 | 81.937 |
| 7 | −1652.923938 | 26.883045 | | | 78.866 |
| 8 | 0.000000 | 138.896699 | | | 67.638 |
| 9 | 175.542348 | 36.333740 | SIO2 | 1.56029525 | 75.651 |
| 10 | −236.570865 | 100.002684 | | | 75.039 |
| 11 | 0.000000 | 9.995756 | | | 59.032 |
| 12 | 0.000000 | 81.094895 | REFL | | 110.211 |
| 13 | −208.565918 | −48.990866 | SIO2 | −1.56029525 | 104.471 |
| 14 | 517.535257 | −178.645431 | | | 104.642 |
| 15 | 398.155640 | −15.000000 | SIO2 | −1.56029525 | 100.231 |
| 16 | −950.114340 | −73.251055 | | | 103.344 |
| 17 | 116.287221 | −15.000000 | SIO2 | −1.56029525 | 104.039 |
| 18 | 473.502609 | −41.360609 | | | 140.152 |
| 19 | 194.854755 | 41.360609 | REFL | | 143.288 |
| 20 | 473.502609 | 15.000000 | SIO2 | 1.56029525 | 139.289 |
| 21 | 116.287221 | 73.251055 | | | 99.401 |
| 22 | −950.114340 | 15.000000 | SIO2 | 1.56029525 | 92.823 |
| 23 | 398.156640 | 178.645431 | | | 87.639 |
| 24 | 517.535257 | 48.990866 | SIO2 | 1.56029525 | 84.803 |
| 25 | −208.565918 | 81.097016 | | | 83.851 |
| 26 | 0.000000 | 84.970261 | | | 59.404 |
| 27 | 176.145326 | 23.179878 | SIO2 | 1.56029525 | 79.591 |
| 28 | 756.736803 | 0.944155 | | | 79.800 |
| 29 | 314.641675 | 30.039119 | SIO2 | 1.56029525 | 80.579 |
| 30 | −500.071834 | 218.126390 | | | 80.744 |
| 31 | −108.651460 | 15.000000 | SIO2 | 1.56029525 | 80.556 |
| 32 | −785.250977 | 30.057005 | | | 106.274 |
| 33 | −182.598151 | −30.057005 | REFL | | 109.565 |
| 34 | −785.250977 | −15.000000 | SIO2 | −1.56029525 | 107.546 |
| 35 | −108.651460 | −218.126390 | | | 87.013 |
| 36 | −500.071834 | −30.039119 | SIO2 | −1.56029525 | 88.079 |
| 37 | 314.641675 | −0.944155 | | | 87.604 |
| 38 | 756.736803 | −23.179878 | SIO2 | −1.56029525 | 86.420 |
| 39 | 176.145326 | −49.965147 | | | 85.965 |
| 40 | 0.000000 | −10.012234 | | | 62.226 |
| 41 | 0.000000 | 69.993842 | REFL | | 66.120 |
| 42 | −340.701792 | 14.476713 | SIO2 | 1.56029525 | 61.548 |
| 43 | −198.092016 | 38.433493 | | | 63.405 |
| 44 | −681.785807 | 14.078463 | SIO2 | 1.56029525 | 69.045 |
| 45 | −317.005432 | 27.751722 | | | 70.244 |
| 46 | −110.357531 | 9.500172 | SIO2 | 1.56029525 | 70.916 |
| 47 | 311.065100 | 22.414990 | | | 86.590 |

TABLE 4

| Face | 4 | 8 = 25 | 11 = 22 | 13 = 20 | 29 | 31 |
|---|---|---|---|---|---|---|
| K | 0 | 0 | 0 | 0 | 0 | 0 |
| C1 | −1.17E−08 | 7.10E−10 | 4.43E−09 | −7.25E−09 | 2.55E−10 | 9.67E−09 |
| C2 | −5.58E−14 | 1.16E−14 | −4.74E−14 | 2.48E−14 | −6.17E−14 | −7.64E−13 |
| C3 | −6.44E−18 | 8.33E−19 | 1.40E−18 | 1.28E−20 | −6.21E−20 | 1.96E−17 |
| C4 | −4.47E−23 | −4.54E−23 | −5.27E−24 | −1.12E−22 | 2.57E−23 | −7.03E−22 |
| C5 | −7.31E−27 | 1.09E−27 | −6.31E−28 | 8.33E−27 | −4.83E−28 | 1.82E−26 |
| C6 | 3.72E−32 | −1.31E−33 | 2.42E−32 | −1.64E−31 | −1.36E−33 | 1.31E−31 |

| Face | 33 | 35 | 40 | 43 | 45 |
|---|---|---|---|---|---|
| K | 0 | 0 | 0 | 0 | 0 |
| C1 | −3.12E−08 | 9.65E−09 | −7.80E−09 | 3.26E−08 | 8.42E−08 |
| C2 | 1.51E−12 | −6.13E−13 | 1.23E−13 | −5.62E−13 | 1.69E−11 |
| C3 | −2.25E−17 | 8.81E−18 | −3.25E−19 | 4.68E−17 | −1.72E−16 |
| C4 | −8.50E−23 | 3.92E−23 | −6.27E−26 | −1.11E−20 | 5.74E−19 |
| C5 | 1.19E−26 | −5.57E−27 | −3.07E−27 | 6.32E−25 | −7.64E−23 |
| C6 | −6.28E−31 | 8.11E−32 | 5.63E−32 | −8.86E−30 | 1.33E−26 |

TABLE 5-continued

| Face | Radii | Thicknesses | Material | Index | ½ diameter |
|---|---|---|---|---|---|
| 48 | −1344.254472 | 43.792412 | SIO2 | 1.56029525 | 90.705 |
| 49 | −138.390126 | 5.810077 | | | 97.254 |
| 50 | 552.864897 | 42.476541 | SIO2 | 1.56029525 | 127.381 |
| 51 | −483.961511 | 63.875640 | | | 129.334 |
| 52 | 1021.980459 | 38.430027 | SIO2 | 1.56029525 | 142.111 |
| 53 | −410.501933 | 0.936239 | | | 142.917 |
| 54 | 578.822230 | 39.856519 | SIO2 | 1.56029525 | 139.665 |
| 55 | −723.060175 | 0.932875 | | | 138.387 |
| 56 | 283.549462 | 33.604225 | SIO2 | 1.56029525 | 124.246 |
| 57 | 1607.080204 | 0.891917 | | | 120.727 |
| 58 | 167.944629 | 33.588386 | SIO2 | 1.56029525 | 106.594 |
| 59 | 370.375071 | 0.941416 | | | 101.486 |
| 60 | 94.822236 | 39.056245 | SIO2 | 1.56029525 | 80.000 |
| 61 | 175.331402 | 0.944860 | | | 70.631 |
| 62 | 58.889747 | 49.845949 | SIO2 | 1.56029525 | 50.337 |
| 63 | 0.000000 | 2.000000 | H2OV193 | 1.43682260 | 19.381 |
| 64 | 0.000000 | −0.000335 | H2OV193 | 1.43682260 | 15.750 |
| 65 | 0.000000 | 0.000335 | | | 15.750 |

TABLE 6

| Face | 3 | 7 | 9 | 14 = 24 | 18 = 20 |
|---|---|---|---|---|---|
| K | 0 | 0 | 0 | 0 | 0 |
| C1 | 2.886968E−08 | 6.178555E−08 | −1.273482E−07 | −2.178828E−08 | 1.372393E−08 |
| C2 | 1.135834E−12 | 6.960497E−13 | 4.938210E−12 | −2.747119E−13 | −3.413863E−13 |
| C3 | 2.526440E−17 | −5.947244E−17 | −3.380917E−16 | 2.007136E−17 | 1.076781E−17 |
| C4 | −2.060922E−21 | 3.751921E−20 | 1.794088E−20 | 1.731842E−21 | −3.256468E−22 |
| C5 | −7.650561E−25 | −4.325897E−24 | −7.057449E−25 | −2.027055E−25 | 6.466061E−27 |
| C6 | 5.723867E−29 | 7.686244E−29 | 2.539541E−30 | 5.423640E−30 | −5.896986E−32 |

| Face | 28 = 38 | 32 = 34 | 48 | 52 | 57 |
|---|---|---|---|---|---|
| K | 0 | 0 | 0 | 0 | 0 |
| C1 | 7.190084E−08 | −3.011106E−08 | −5.757903E−08 | −3.792122E−08 | −2.413143E−08 |
| C2 | −5.639061E−13 | 1.342687E−12 | 1.903176E−12 | 1.535276E−12 | 2.795676E−12 |
| C3 | 9.086478E−18 | −6.959794E−17 | −7.267601E−17 | −1.992532E−17 | −1.365078E−16 |
| C4 | 8.555051E−22 | 3.712216E−21 | 1.940815E−21 | −4.676144E−22 | 5.749863E−21 |
| C5 | −2.763206E−26 | −1.392566E−25 | −1.899677E−25 | 2.069154E−26 | −1.655627E−25 |
| C6 | −9.351012E−31 | 2.691744E−30 | −4.747025E−30 | −2.314945E−31 | 2.725293E−30 |

TABLE 7

| Face | Radii | Thicknesses | Material | Index | ½ diameter |
|---|---|---|---|---|---|
| 0 | 0.000000 | 40.000000 | | | 63.000 |
| 1 | 0.000000 | 0.000000 | | | 72.900 |
| 2 | 169.031176 | 30.007246 | SIO2HL | 1.56029525 | 77.565 |
| 3 | 172.807988 | 86.884665 | | | 76.339 |
| 4 | 262.433301 | 42.053156 | SIO2HL | 1.56029525 | 100.639 |
| 5 | −396.930898 | 170.685368 | | | 100.745 |
| 6 | 91.344370 | 19.740243 | SIO2HL | 1.56029525 | 71.904 |
| 7 | 105.469868 | 16.142176 | | | 67.557 |
| 8 | 137.822248 | 20.121802 | SIO2HL | 1.56029525 | 65.141 |
| 9 | 591.277033 | 20.282197 | | | 61.580 |
| 10 | 0.000000 | 102.718997 | | | 54.773 |
| 11 | 344.588322 | 32.632993 | SIO2HL | 1.56029525 | 64.580 |
| 12 | −119.973712 | 98.386450 | | | 64.972 |
| 13 | 0.000000 | 10.002615 | | | 42.632 |
| 14 | 0.000000 | −100.001190 | REFL | | 118.932 |
| 15 | −248.418133 | −48.786808 | SIO2HL | −1.56029525 | 101.847 |
| 16 | 260.257319 | −174.240023 | | | 102.623 |
| 17 | 751.662806 | −15.000000 | SIO2HL | −1.56029525 | 96.605 |
| 18 | −546.358993 | −49.118038 | | | 97.378 |
| 19 | 142.990930 | −15.000000 | SIO2HL | −1.56029525 | 97.645 |
| 20 | 1260.283293 | −34.592380 | | | 115.849 |

TABLE 7-continued

| Face | Radii | Thicknesses | Material | Index | ½ diameter |
|---|---|---|---|---|---|
| 21 | 192.845940 | 34.592380 | REFL | | 117.242 |
| 22 | 1260.283293 | 15.000000 | SIO2HL | 1.56029525 | 114.937 |
| 23 | 142.990930 | 49.118038 | | | 91.181 |
| 24 | −546.358993 | 15.000000 | SIO2HL | 1.56029525 | 86.779 |
| 25 | 751.662806 | 174.240023 | | | 82.828 |
| 26 | 260.257319 | 48.786808 | SIO2HL | 1.56029525 | 78.494 |
| 27 | −248.418133 | 99.999230 | | | 75.744 |
| 28 | 0.000000 | 95.015900 | | | 42.841 |
| 29 | 177.681287 | 30.008789 | SIO2HL | 1.56029525 | 65.929 |
| 30 | −516.705121 | 171.287965 | | | 67.227 |
| 31 | 217.817800 | 29.576821 | SIO2HL | 1.56029525 | 88.903 |
| 32 | 310.498099 | 41.618560 | | | 86.845 |
| 33 | −166.352653 | 15.000000 | SIO2HL | 1.56029525 | 86.950 |
| 34 | 439.160019 | 39.859648 | | | 98.417 |
| 35 | −192.193047 | −39.859648 | REFL | | 100.860 |
| 36 | 439.160019 | −15.000000 | SIO2HL | −1.56029525 | 99.124 |
| 37 | −166.352653 | −41.618560 | | | 87.790 |
| 38 | 310.498099 | −29.576821 | SIO2HL | −1.56029525 | 87.638 |
| 39 | 217.817800 | −171.287965 | | | 89.485 |
| 40 | −516.705121 | −30.008789 | SIO2HL | −1.56029525 | 64.348 |
| 41 | 177.681287 | −60.011782 | | | 62.727 |
| 42 | 0.000000 | −9.997120 | | | 44.036 |
| 43 | 0.000000 | 90.957117 | REFL | | 58.394 |
| 44 | 144.598375 | 33.191986 | SIO2HL | 1.56029525 | 66.065 |
| 45 | −312.576397 | 52.726003 | | | 66.275 |
| 46 | −107.389980 | 9.492973 | SIO2HL | 1.56029525 | 62.695 |
| 47 | 165.658290 | 32.869123 | | | 71.558 |
| 48 | −577.192238 | 25.782062 | SIO2HL | 1.56029525 | 78.414 |
| 49 | −150.951285 | 0.976825 | | | 84.261 |
| 50 | 29506.35748 | 24.339009 | SIO2HL | 1.56029525 | 100.691 |
| 51 | −374.391026 | 0.956935 | | | 104.021 |
| 52 | 644.947215 | 57.187603 | SIO2HL | 1.56029525 | 113.079 |
| 53 | −174.623921 | 16.895926 | | | 114.436 |
| 54 | 1344.546605 | 39.235791 | SIO2HL | 1.56029525 | 103.044 |
| 55 | −218.318622 | 12.126286 | | | 101.595 |
| 56 | −165.249581 | 9.493815 | SIO2HL | 1.56029525 | 99.807 |
| 57 | −529.158535 | 0.942157 | | | 101.677 |
| 58 | 199.277639 | 44.383379 | SIO2HL | 1.56029525 | 100.857 |
| 59 | — | 7.470338 | | | 98.182 |
| 60 | 208.537801 | 18.754883 | SIO2HL | 1.56029525 | 85.455 |

TABLE 7-continued

| Face | Radii | Thicknesses | Material | Index | ½ diameter |
|---|---|---|---|---|---|
| 61 | 334.304631 | 5.703329 | | | 80.986 |
| 62 | 83.732122 | 29.895330 | SIO2HL | 1.56029525 | 65.881 |
| 63 | 175.404465 | 0.950929 | | | 58.182 |
| 64 | 81.491876 | 26.728679 | SIO2HL | 1.56029525 | 51.783 |
| 65 | 443.279667 | 3.284129 | | | 42.929 |
| 66 | 0 | 10 | SIO2HL | 1.56029525 | 39.654 |
| 67 | 0 | 6 | | | 32.119 |
| 68 | 0 | 0 | | | 15.764 |

TABLE 8

| Face | 3 | 9 | 11 | 16 = 26 | 20 = 22 |
|---|---|---|---|---|---|
| K | 0 | 0 | 0 | 0 | 0 |
| C1 | 3.188825E−08 | 5.249301E−08 | −1.523480E−07 | −2.416867E−08 | 2.294396E−08 |
| C2 | 2.650655E−13 | 9.672904E−12 | 6.099552E−12 | −5.962244E−13 | −1.007737E−12 |
| C3 | −6.675542E−17 | 5.067159E−15 | −1.442430E−16 | 1.303177E−17 | 5.222514E−17 |
| C4 | 2.771063E−20 | −2.297083E−19 | −4.973879E−20 | 4.998372E−22 | −4.373272E−21 |
| C5 | −3.914426E−24 | 4.468892E−23 | 1.037858E−23 | 2.854081E−26 | 2.022375E−25 |
| C6 | 2.025798E−28 | 6.699558E−27 | −7.916827E−28 | −4.246522E−30 | −5.622426E−30 |

| Face | 30 = 40 | 36 = 34 | 48 | 52 | 63 |
|---|---|---|---|---|---|
| K | 0 | 0 | 0 | 0 | 0 |
| C1 | 7.462841E−08 | −6.215300E−08 | −1.263170E−07 | −3.644419E−08 | 1.073460E−07 |
| C2 | −1.480049E−12 | 3.990211E−12 | 1.704645E−12 | 2.830363E−12 | 3.012743E−11 |
| C3 | 7.038597E−18 | −2.682924E−16 | −1.072376E−16 | −6.930387E−17 | −1.142275E−15 |
| C4 | −6.746798E−21 | 1.575407E−20 | 1.095795E−19 | −7.697280E−21 | 2.057679E−19 |
| C5 | 1.842201E−24 | −6.565311E−25 | −9.786894E−24 | 7.864096E−25 | 1.754484E−23 |
| C6 | −1.185318E−28 | 1.800037E−29 | 8.828862E−28 | −2.506008E−29 | 3.450730E−27 |

The invention claimed is:

1. A projection exposure machine for microlithography, comprising:
 a catadioptric projection objective for projecting a mask pattern arranged in an object plane of the projection objective into an image plane of the projection objective with the formation of at least one real intermediate image;
 a device for moving a mask bearing the mask pattern perpendicular to an optical axis of the projection objective;
 a device for moving a substrate arranged in a region of the image plane perpendicular to the optical axis of the projection objective; and
 a device for introducing an immersion medium with a high refractive index between an exit surface of the projection objective and the image plane during operation,
 wherein the projection objective has at least one catadioptric objective part that comprises a concave mirror;
 wherein a sum S of a number of the intermediate images and a number of mirrors of the projection objective including the at least one concave mirror is an odd whole number; and
 wherein a control device for driving the device for moving the mask and for driving the device for moving the substrate is configured in such a way that the mask and the substrate are moved synchronously in the same, parallel directions;
 wherein the projection objective has an image-side numerical aperture NA>0.98 in conjunction with the immersion medium; and
 wherein the projection objective has at least two concave mirrors.

2. The projection exposure machine according to claim 1, wherein the projection objective includes at least one planar folding mirror in addition to the at least one concave mirror and wherein the sum S of a number Z of the intermediate images, a number F of the folding mirrors and a number K of the concave mirrors of the projection objective is an odd whole number.

3. The projection exposure machine according to claim 2, wherein a first beam section running from the object plane to the concave mirror and a second beam section running from the concave mirror to the image plane are generated; and the folding mirror is arranged with reference to the concave mirror in such a way that one of the beam sections is folded at the folding mirror and the other beam section passes the first folding mirror without vignetting, and the first beam section and the second beam section cross one another in a cross-over region.

4. The projection exposure machine according to claim 2, wherein at least one second folding mirror is provided in addition to the folding mirror.

5. The projection exposure machine according to claim 1, wherein at least one intermediate image is arranged in the optical vicinity of a mirror.

6. The projection exposure machine according to claim 1, wherein no optical element is arranged between the intermediate image and an optically most closely situated mirror.

7. The projection exposure machine according to claim 1, wherein the intermediate image is arranged at a spacing from an optically closest mirror.

8. The projection exposure machine according to claim 1, wherein the projection objective has at least two catadioptric objective parts which in each case have a concave mirror and a folding mirror, assigned to the concave mirror, for deflecting the radiation coming from the object plane to the concave mirror, or for deflecting to the image plane the radiation reflected by the concave mirror.

9. The projection exposure machine according to claim 1, wherein a number of at least two intermediate images are provided and all the intermediate images are arranged in the geometric vicinity of a folding mirror.

10. A catadioptric projection objective for projecting a mask pattern arranged in an object plane of the projection objective into an image plane of the projection objective with the formation of at least one real intermediate image, comprising:

at least one catadioptric objective part comprising a concave mirror;

wherein a sum S of a number of the intermediate images and a number of mirrors of the projection objective including the at least one concave mirror is an odd whole number; and wherein the projection objective is adapted for use with a projection exposure machine having a control device for driving a device for moving the mask and for driving a device for moving the substrate arranged in a region of the image plane of the projection objective and wherein the control device is configured such that the mask and the substrate move synchronously in the same, parallel directions;

wherein the projection objective is designed as an immersion objective so that during operation an immersion medium with a high refractive index is introduced between an exit surface of the projection objective and the image plane;

wherein the projection objective has an image-side numerical aperture NA>0.98 in conjunction with the immersion medium; and wherein the projection objective has at least two concave mirrors.

11. The projection objective according to claim 10, wherein the projection objective includes at least one planar folding mirror in addition to the at least one concave mirror and wherein the sum S of a number Z of the intermediate images, a number F of the folding mirrors and a number K of the concave mirrors of the projection objective is an odd whole number.

12. The projection objective according to claim 11, wherein a first beam section running from the object plane to the concave mirror and a second beam section running from the concave mirror to the image plane are generated; and the folding mirror is arranged with reference to the concave mirror in such a way that one of the beam sections is folded at the folding mirror and the other beam section passes the folding mirror without vignetting, and the first beam section and the second beam section cross one another in a cross-over region.

13. The projection objective according to claim 11, wherein at least one second folding mirror is provided in addition to the folding mirror.

14. The projection objective according to claim 10, wherein at least one intermediate image is arranged in the optical vicinity of a mirror.

15. The projection objective according to claim 10, wherein no optical element is arranged between the intermediate image and an optically most closely situated mirror.

16. The projection objective according to claim 10, wherein the intermediate image is arranged at a spacing from an optically closest mirror.

17. The projection objective according to claim 10, wherein the projection objective has at least two catadioptric objective parts which in each case have a concave mirror and a folding mirror, assigned to the concave mirror, for deflecting the radiation coming from the object plane to the concave mirror, or for deflecting to the image plane the radiation reflected by the concave mirror.

18. The projection objective according to claim 10, wherein a number of at least two intermediate images are provided and all the intermediate images are arranged at a spacing from a mirror.

19. A projection exposure machine for microlithography, comprising:

a catadioptric projection objective for projecting a mask pattern arranged in an object plane of the projection objective into an image plane of the projection objective with the formation of at least one real intermediate image;

a device for moving a mask bearing the mask pattern perpendicular to an optical axis of the projection objective;

a device for moving a substrate arranged in a region of the image plane perpendicular to the optical axis of the projection objective; and a device for introducing an immersion medium with a high refractive index between an exit surface of the projection objective and the image plane during operation, wherein the projection objective has at least one catadioptric objective part that comprises a concave mirror;

wherein a sum S of a number of the intermediate images and a number of mirrors of the projection objective including the at least one concave mirror is an odd whole number;

wherein a control device for driving the device for moving the mask and for driving the device for moving the substrate is configured in such a way that the mask and the substrate are moved synchronously in the same, parallel directions;

wherein the projection objective has an image-side numerical aperture NA>0.98 in conjunction with the immersion medium;

wherein the projection objective includes at least one planar folding mirror in addition to the at least one concave mirror and wherein the sum S of a number Z of the intermediate images, a number F of the folding mirrors and a number K of the concave mirrors of the projection objective is an odd whole number; and wherein a first beam section running from the object plane to the concave mirror and a second beam section running from the concave mirror to the image plane are generated; and the folding mirror is arranged with reference to the concave mirror in such a way that one of the beam sections is folded at the folding mirror and the other beam section passes the first folding mirror without vignetting; and the first beam section and the second beam section cross one another in a cross-over region.

20. A catadioptric projection objective for projecting a mask pattern arranged in an object plane of the projection objective into an image plane of the projection objective with the formation of at least one real intermediate image, comprising:

at least one catadioptric objective part comprising a concave mirror;

wherein a sum S of a number of the intermediate images and a number of mirrors of the projection objective including the at least one concave mirror is an odd whole number; and wherein the projection objective is adapted for use with a projection exposure machine having a control device for driving a device for moving the mask and for driving a device for moving the substrate arranged in a region of the image plane of the projection objective and wherein the control device is configured such that the mask and the substrate move synchronously in the same, parallel directions;

wherein the projection objective is designed as an immersion objective so that during operation an immersion medium with a high refractive index is introduced between an exit surface of the projection objective and the image plane;

wherein the projection objective has an image-side numerical aperture NA>0.98 in conjunction with the immersion medium;

wherein the projection objective includes at least one planar folding mirror in addition to the at least one concave mirror and wherein the sum S of a number Z of the intermediate images, a number F of the folding mirrors and a number K of the concave mirrors of the projection objective is an odd whole number; and wherein a first beam section running from the object plane to the concave mirror and a second beam section running from the concave mirror to the image plane are generated; and the folding mirror is arranged with reference to the concave mirror in such a way that one of the beam sections is folded at the folding mirror and the other beam section passes the first folding mirror without vignetting, and the first beam section and the second beam section cross one another in a cross-over region.

21. A projection exposure machine for microlithography, comprising:

a catadioptric projection objective for projecting a mask pattern arranged in an object plane of the projection objective into an image plane of the projection objective with the formation of at least one real intermediate image;

a device for moving a mask bearing the mask pattern perpendicular to an optical axis of the projection objective;

a device for moving a substrate arranged in a region of the image plane perpendicular to the optical axis of the projection objective; and a device for introducing an immersion medium with a high refractive index between an exit surface of the projection objective and the image plane during operation, wherein the projection objective has at least one catadioptric objective part that comprises a concave mirror;

wherein a sum S of a number of the intermediate images and a number of mirrors of the projection objective including the at least one concave mirror is an odd whole number;

wherein a control device for driving the device for moving the mask and for driving the device for moving the substrate is configured in such a way that the mask and the substrate are moved synchronously in the same, parallel directions;

wherein the projection objective has an image-side numerical aperture NA>0.98 in conjunction with the immersion medium; and wherein the projection objective has at least two catadioptric objective parts which in each case have a concave mirror and a folding mirror, assigned to the concave mirror, for deflecting the radiation coming from the object plane to the concave mirror, or for deflecting to the image plane the radiation reflected by the concave mirror.

22. A catadioptric projection objective for projecting a mask pattern arranged in an object plane of the projection objective into an image plane of the projection objective with the formation of at least one real intermediate image, comprising:

at least one catadioptric objective part comprising a concave mirror;

wherein a sum S of a number of the intermediate images and a number of mirrors of the projection objective including the at least one concave mirror is an odd whole number; and wherein the projection objective is adapted for use with a projection exposure machine having a control device for driving a device for moving the mask and for driving a device for moving the substrate arranged in a region of the image plane of the projection objective and wherein the control device is configured such that the mask and the substrate move synchronously in the same, parallel directions;

wherein the projection objective is designed as an immersion objective so that during operation an immersion medium with a high refractive index is introduced between an exit surface of the projection objective and the image plane;

wherein the projection objective has an image-side numerical aperture NA>0.98 in conjunction with the immersion medium; and wherein the projection objective has at least two catadioptric objective parts which in each case have a concave mirror and a folding mirror, assigned to the concave mirror, for deflecting the radiation coming from the object plane to the concave mirror, or for deflecting to the image plane the radiation reflected by the concave mirror.

* * * * *